(12) United States Patent
DeJack et al.

(10) Patent No.: US 6,904,395 B1
(45) Date of Patent: Jun. 7, 2005

(54) SYSTEM AND METHOD OF GENERATING A FINITE ELEMENT MESH FOR A THREADED FASTENER AND JOINING STRUCTURE ASSEMBLY

(75) Inventors: Michael A. DeJack, Whitmore Lake, MI (US); David G. Strenski, Ypsilanti, MI (US); Paul R. Kinney, Westland, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 764 days.

(21) Appl. No.: 09/639,870

(22) Filed: Aug. 16, 2000

(51) Int. Cl.[7] .............................................. G06F 9/455
(52) U.S. Cl. ....................................................... 703/7
(58) Field of Search .............................. 703/7; 403/362; 92/150; 411/508, 427, 383; 162/343; 188/218; 716/20; 254/93 R; 345/427

(56) References Cited

U.S. PATENT DOCUMENTS

| | | | | |
|---|---|---|---|---|
| 4,359,206 A | * | 11/1982 | McCreery | 254/93 R |
| 5,070,534 A | | 12/1991 | Lascelles et al. | 345/704 |
| 5,111,413 A | | 5/1992 | Lazansky et al. | 703/14 |
| 5,197,120 A | | 3/1993 | Saxton et al. | 345/661 |
| 5,738,476 A | * | 4/1998 | Assimakopoulos | 411/508 |
| 5,920,491 A | * | 7/1999 | Hibbitt et al. | 703/7 |
| 5,927,921 A | * | 7/1999 | Hukari | 411/427 |
| 5,946,479 A | * | 8/1999 | Sakaguchi et al. | 716/20 |
| 5,956,500 A | * | 9/1999 | Shimmell | 703/7 |
| 6,045,310 A | * | 4/2000 | Miller et al. | 411/383 |
| 6,074,121 A | * | 6/2000 | Medeiros et al. | 403/362 |
| 6,153,057 A | * | 11/2000 | Aidun | 162/343 |
| 6,267,210 B1 | * | 7/2001 | Burgoon et al. | 188/218 |
| 6,467,394 B1 | * | 10/2002 | Wood et al. | 92/150 |

OTHER PUBLICATIONS

Zicheng et al., "A study of helical coordinate system and helical slow wave structure", IEEE 1998.*

Lafon, "Solid Modeling With Contraints and Parameterised Features", IEEE, Jul. 1998.

Jinsong et al., "Parametric Design with Intelligence Configuration Analysis Mechanism", IEEE, Nov. 1993.

Mateos et al., "Parameteric and Associative Design of Cartridges of Speical Tools", IEEE 1995.

* cited by examiner

Primary Examiner—Kevin J. Teska
Assistant Examiner—Kandasamy Thangavelu
(74) Attorney, Agent, or Firm—David B. Kelley

(57) ABSTRACT

A system and method of generating a finite element mesh for a threaded fastener and joining structure assembly includes a computer system for generating a mesh model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates. The system and method also includes a user evaluating the mesh model of the threaded fastener and joining structure assembly using finite element analysis and evaluating a result of the finite element analysis using a visualization software program and a computer system. The system and method further includes a user predicting a stress of the threaded fastener and joining structure assembly from the evaluation of the result of the finite element analysis.

18 Claims, 21 Drawing Sheets

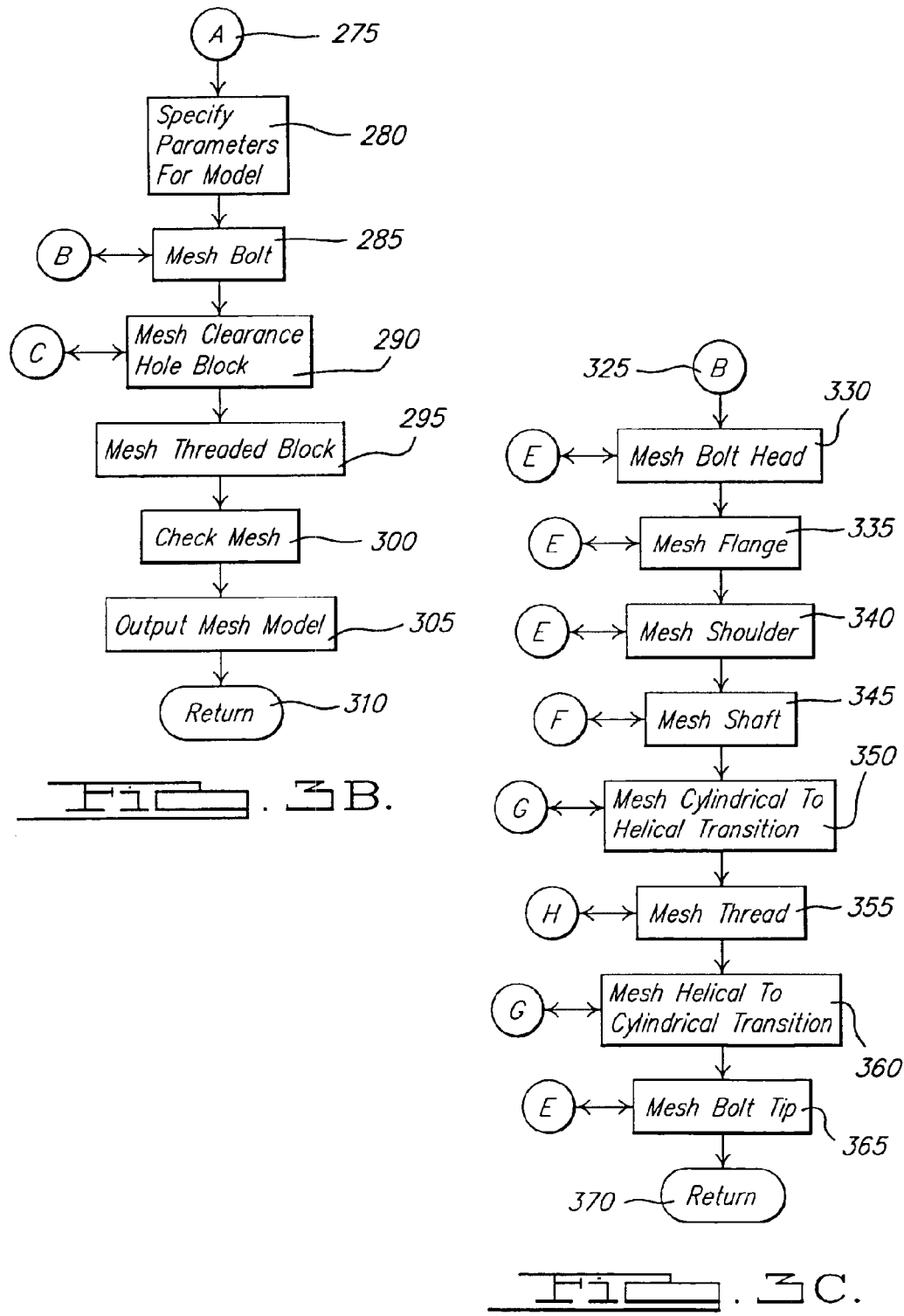

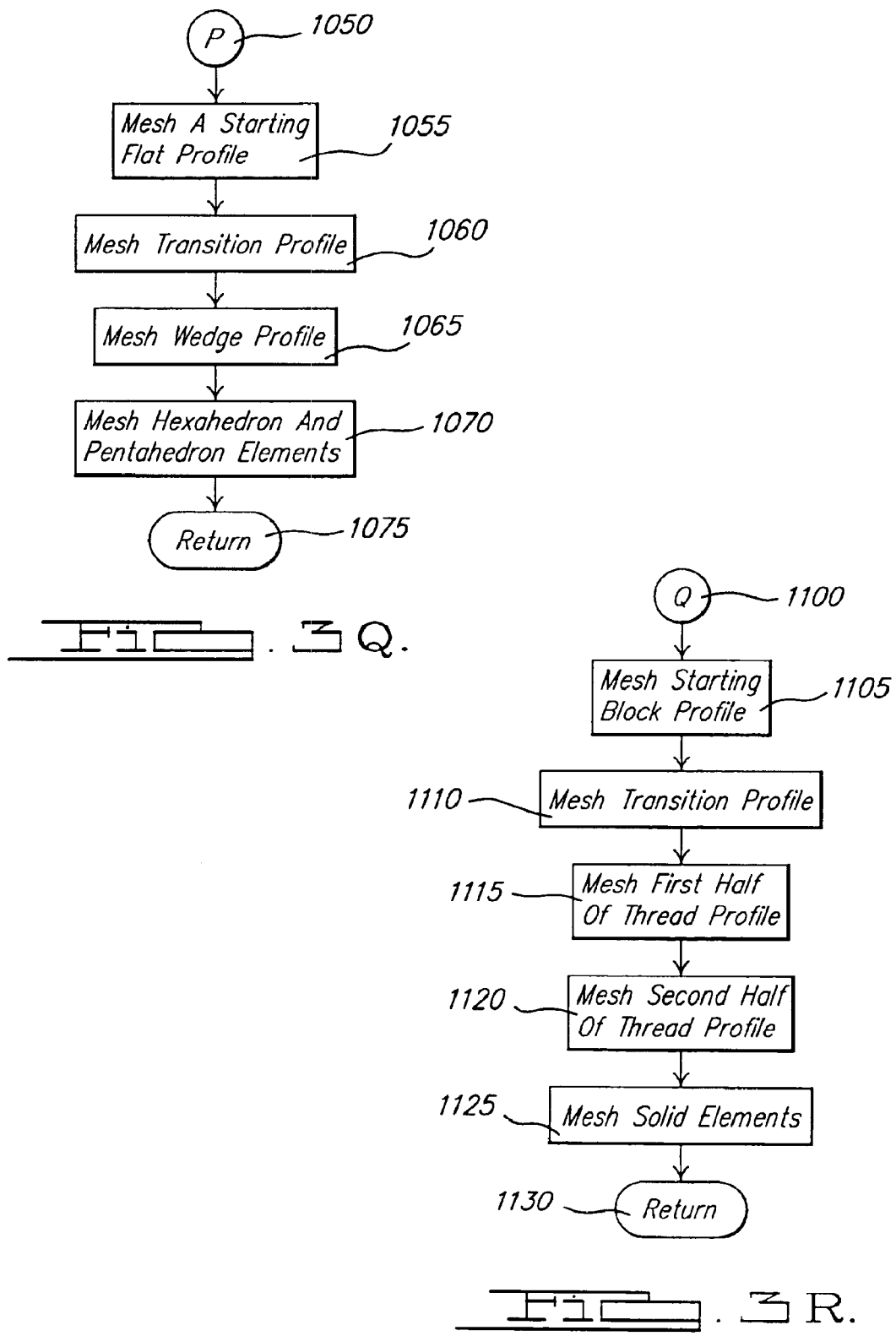

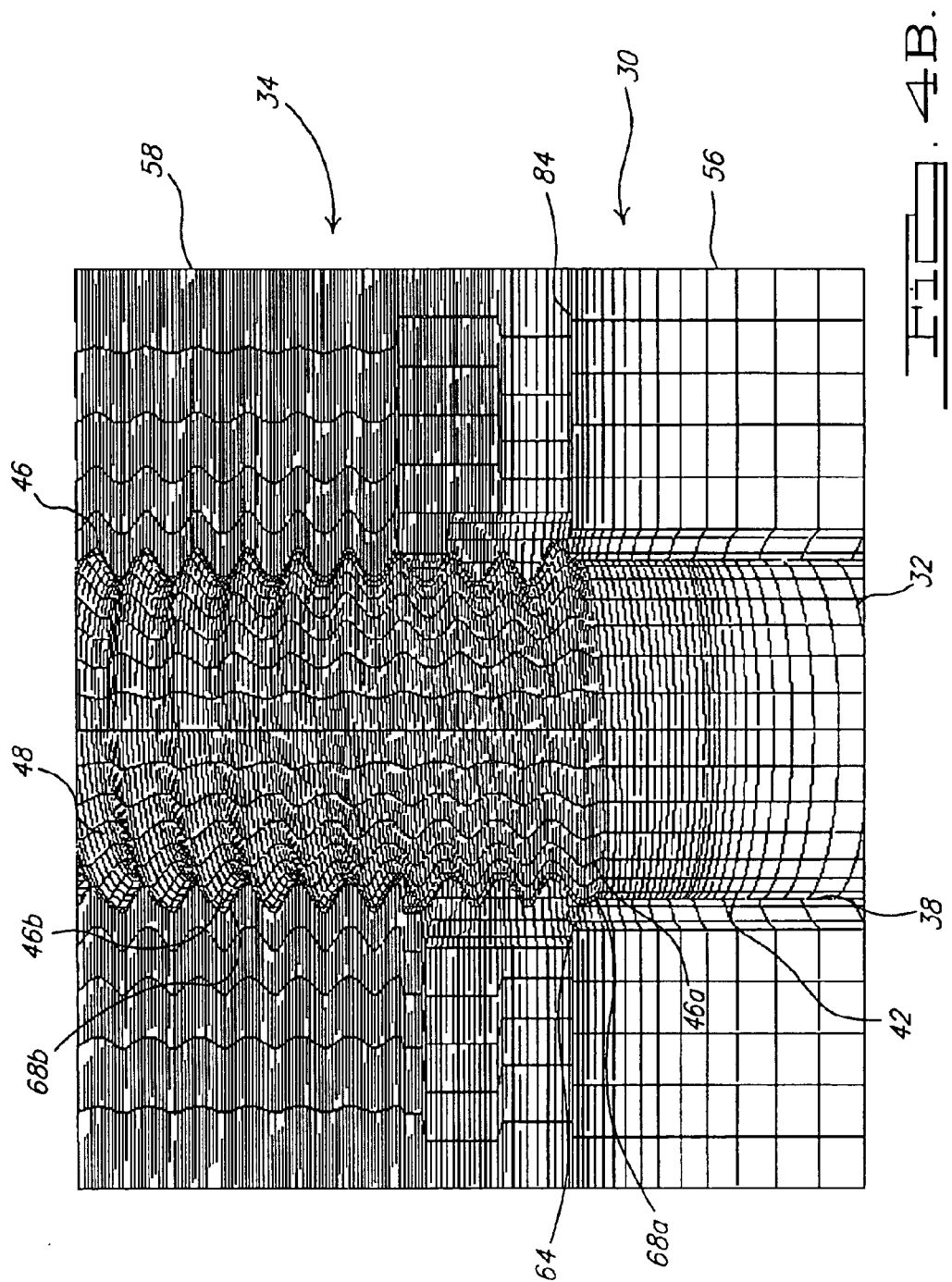

SYSTEM AND METHOD OF GENERATING A FINITE ELEMENT MESH FOR A THREADED FASTENER AND JOINING STRUCTURE ASSEMBLY

BACKGROUND OF THE INVENTION

1. Field of the Invention

The present invention relates generally to finite element analysis of a threaded fastener and, more specifically, to a system and method of generating a finite element mesh for a threaded fastener and joining structure assembly.

2. Description of the Related Art

Fastener design, and in particular the design of a threaded fastener, has advanced to a state in which computer-aided design techniques are frequently incorporated in the development and analysis of a threaded fastener and a structure joined together by the threaded fastener, such as two blocks. Computer-aided design is especially beneficial in analyzing a stress in a joining structure resulting from the load transfer through contacting threads of the threaded fastener and mating surfaces in the joining structure. For example, a fatigue failure, such as a crack in a thread root, may occur in a threaded portion of the joining structure. The ability to predict a stress and potential fatigue failure in a threaded fastener or joining structure under an operating load is advantageous in the design of the fastener and the bolted joint.

It is known to utilize a strain gauge to determine the state of stress on a part in which a load has been applied. However, it is extremely difficult to position a strain gage at the thread interface between the threaded fastener and the joining structure and still be able to recreate the stress. It is also difficult to reproduce the effect of other loading factors, including thermal loading.

It is also known to use a classical analytical technique to identify stresses and areas of high stress concentration within a structure. For example, the thread and joining structure behavior is approximated and the model is empirically corrected to fit experimental observations. However, this technique only evaluates stresses and fatigue in the bolt shank, bolt thread stripping, and bolt fatigue, and doesn't consider stress in the block threads or contacting surfaces.

Another known analytical technique is finite element analysis. In the past, a simple model was used to reduce model size and complexity. For example, the fastener and the joining structure are modeled in two dimensions, and a computer simulation is performed to approximate the stresses of the contacting threads. However, a two-dimensional analysis assumes that the bolt is axi-symmetric, and helical threads are not axi-symmetric. Thus, there is a need in the art for a system and method of generating a finite element mesh of a threaded fastener and a joining structure for stress analysis and evaluation purposes, to more accurately predict fatigue behavior.

SUMMARY OF THE INVENTION

Accordingly, the present invention is a system and method of generating a finite element mesh for a threaded fastener and joining structure assembly. The system includes a computer system for generating a mesh model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates. The system also includes a user evaluating the mesh model of the threaded fastener and joining structure assembly using finite element analysis and evaluating a result of the finite element analysis. The system further includes a user predicting a stress of the threaded fastener and joining structure assembly from the evaluation of the result of the finite element analysis.

The method includes the steps of generating a mesh model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates. The method also includes the steps of evaluating the mesh model of the threaded fastener and joining structure assembly using finite element analysis and evaluating a result of the finite element analysis. The method further includes the steps of predicting a stress of the threaded fastener and joining structure assembly from the evaluation of the result of the finite element analysis.

One advantage of the present invention is that an improved system and method of generating a finite element mesh for a threaded fastener and joining structure is provided that produces a good quality three dimensional mesh while considerably reducing design time and related expenses. Another advantage of the present invention is that the system and method utilizes parametric automated design in light of predetermined engineering and manufacturing criteria. Yet another advantage of the present invention is that the system and method facilitates fatigue analysis of the threaded fastener and joining structure early in the design process. Still another advantage of the present invention is that the system and method supports computer-aided engineering analysis (CAE) and rapid prototyping. A further advantage of the present invention is that the system and method enhances flexibility in design, while still meeting vehicle timing considerations. Still a further advantage of the present invention is that the system and method utilizes knowledge, guidelines and lessons learned from design, engineering and manufacturing experience to design the threaded fastener and joining structure to improve the quality, reduce development time and reduce the cost of such.

Other objects, features and advantages of the present invention will be readily appreciated, as the same becomes better understood, after reading the subsequent description taken in conjunction with the accompanying drawings.

BRIEF DESCRIPTION OF THE DRAWINGS

FIGS. 4A through 4C are examples of a finite element mesh for a threaded fastener and joining structure, according to the system and method of FIGS. 3A through 3R.

FIGS. 6A through 6D are examples of a non-uniform finite element mesh for a threaded fastener according to the method of FIGS. 3A through 3R.

DESCRIPTION OF THE PREFERRED EMBODIMENT(S)

The design of a fastener and joining structure, and in particular the design of a threaded fastener and joining structure for use as an assembly on a vehicle, is achieved according to the present invention with a generic, parametric driven design method. Advantageously, this system and method allows flexibility in design of the threaded fastener and joining structure and engineering analysis of the design in a fraction of the time required using conventional design methods, since the design is automatically evaluated against rules in a knowledge base. Various computer-based tools are integrated into a single user interface to achieve this enormous time and expense savings, including solid modeling, parametric design, automated studies and a knowledge-based engineering library.

Figure 1:
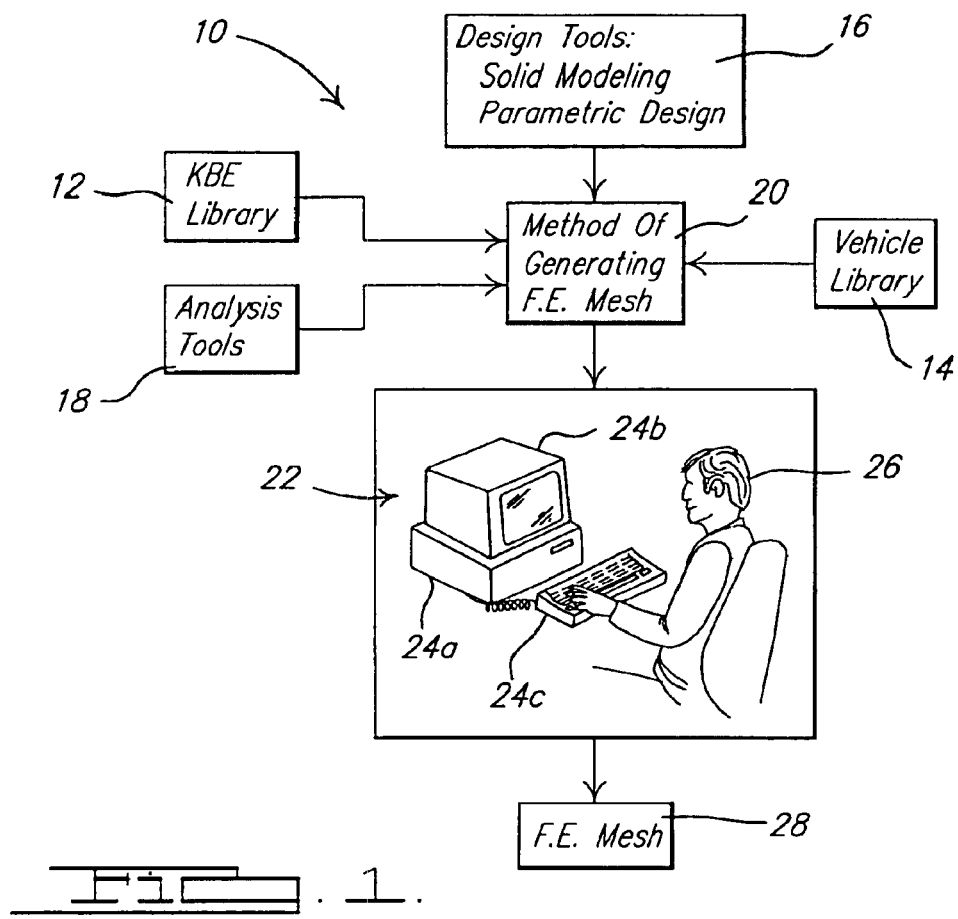
FIG. 1 is a block diagram of a system which may be utilized with a method of generating a finite element mesh for a threaded fastener and joining structure, according to the present invention.

Referring to the drawings and in particular FIG. 1, the tools 10 used by a system and method for generating a finite element mesh for a threaded fastener and joining structure, according to the present invention, are illustrated graphically. The tools 10 include a knowledge-based engineering library 12 stored on an electronic storage device (not shown). The knowledge-based engineering library 12 includes design, engineering, and assembly rules for a fastener or joining structure. In this example, the knowledge-based engineering library 12 is a database of sub-libraries containing an electronic representation of various experts' knowledge of information relevant to the design of the fastener and joining structure. For example, the knowledge-based engineering library 12 includes a component parts library such as a fastener library containing a database of various types of fasteners that may be available for use with the joining structure. It should be appreciated that the fastener may be parametrically modeled. The knowledge-based engineering library 12 may also provide interactive access to other web-based libraries.

The tools 10 also include a vehicle platform library 14 stored on the electronic storage device. The vehicle platform library 14 is an electrical representation of a vehicle platform or a portion thereof. For example, the vehicle platform library 14 may include a model of a particular vehicle body design, or a portion thereof such as an engine mount or engine block. It should be appreciated that the vehicle platform library 14 may be a sub-library within the knowledge-based engineering library 12.

The tools 10 may also include various design tools, shown generally at 16, which can be used for this design method 20, in a manner to be described. These design tools 16 may include solid modeling and parametric design techniques. Solid modeling, for example, takes electronically stored vehicle design data from the vehicle platform library 14 and standard threaded fastener data from the knowledge-based engineering library 12 and builds complex geometry for part-to-part or full assembly stress analysis. Several modeling programs are commercially available and generally known to those skilled in the art.

The parametric design technique is used in the electronic construction within a computer system 22 to be described, for a geometrically defined vehicle system, such as the threaded fastener. As a particular dimension or parameter is modified for a particular feature of the threaded fastener or joining structure, the computer system 22 is instructed to regenerate a new geometric model. The knowledge-based engineering library 12 is used to control and limit the design process in accordance with predetermined design parameters, to be described.

The tools 10 also include various computer-aided engineering (CAE) analysis tools 18. One example of a CAE analysis tool 18 is a finite element analysis software program, such as NASTRAN, or ABAQUS. Another example of a CAE analysis tool 18 is a visualization software program. Finite element analysis is used to analyze stress in a structure and to predict fatigue failures in areas of the structure with high stresses. The finite element analysis program receives as an input a data file containing a mesh model of the structure to be analyzed, as in known in the art. The output from the finite element analysis may be presented visually using the visualization software program.

The tools 10 further include the computer system 22 as is known in the art to implement a method of generating a finite element mesh for a threaded fastener and joining structure according to the present invention for use by the finite element analysis software program. The computer system 22 includes a processor and a memory 24a, which can provide a display and animation of a system, such as the threaded fastener and joining structure, on a display device such as a video terminal 24b. Parametric selection and control for the design can be achieved by a user 26, via a user interactive device 24c, such as a keyboard or a mouse. The user 26 inputs a set of parameters and set of instructions into the computer system 22 when prompted to do so by the method 20. The set of parameters and the set of instructions may be product specific, wherein other data and instructions non-specific to the product may already be stored in the computer system 22.

One example of an input method is a pop-up window with all current parameters, including an on-line description for the parameter and a current value therefore. For example, parametric values may be chosen from a table within a two-dimensional mode, since some vehicle designers prefer to view an assembly in sections which can be laid out on a drawing.

Once the computer system 22 receives the set of parameters and instructions from a user 26, the computer system 22 utilizes a system and method, discussed in detail subsequently, to generate the finite element mesh.

Advantageously, the computer implemented system and method of generating a finite element mesh for a threaded fastener and joining structure, according to the present invention, combines all of the foregoing to provide an efficient, flexible, and rapid design. Further, a data file 28 containing a finite element mesh of the threaded fastener and joining structure is an output of the system and method 20, and the data file 28 is available for further analysis and study.

Figure 2:
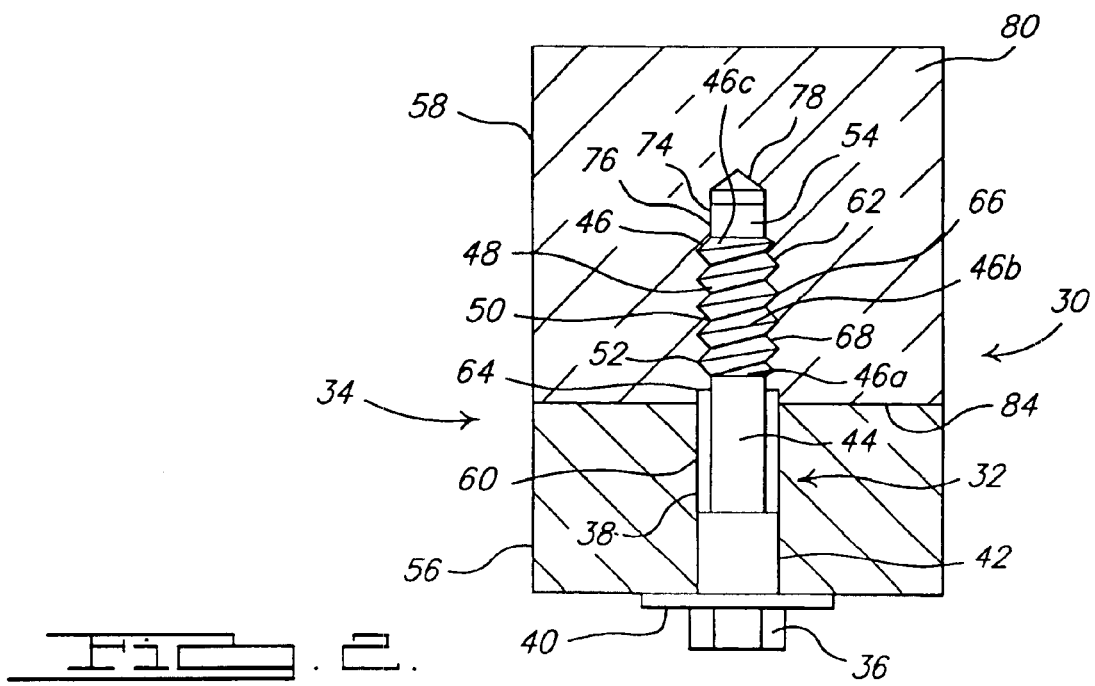
FIG. 2 is a cross-sectional view of a threaded fastener and joining structure, according to the present invention.

Referring to FIG. 2, a threaded fastener and joining structure assembly 30, according to the present invention, is illustrated. It should be appreciated that the threaded fastener and joining structure assembly 30 are part of a vehicle (not shown), and in particular an automotive vehicle. It should also be appreciated that the threaded fastener 32 of this example is a shoulder bolt, and the joining structure 34 is an aluminum end cap bolted to a steel engine block, as are both known in the art.

The threaded fastener 32 includes a head 36 extending radially and a shaft 38 extending axially from the head 36. A portion of the head 36 near the shaft 38 forms a radially extending flange 40. A proximate end of the shaft 38 includes a shoulder portion 42, which extends radially a predetermined distance and axially a predetermined distance. The shaft 38 includes a nonthreaded portion 44 extending axially a predetermined distance and a threaded portion 46 extending axially a predetermined distance. A thread 48 on the shaft 38 has a profile with a root 50 and a peak 52. A distal end of the shaft 38 includes a tip portion 54, which extends radially a predetermined distance and axially a predetermined distance.

The joining structure 34 in this example includes two blocks that are secured together by the threaded fastener 32. Preferably a clearance hole block 56 is the end cap and a threaded block 58 is the engine block. The clearance hole block 56 includes a clearance block aperture 60 extending therethrough the clearance hole block 56 for receiving the shoulder 42 and unthreaded portions 44 of the shaft 38 of the threaded fastener 32, known in the art as a clearance hole.

The threaded block 58 includes a threaded lock aperture 62 extending partially therethrough the threaded block 58 for receiving the threaded portion 46 and tip 54 of the shaft 38 of the threaded fastener 32. The threaded block 58 also includes a chamfer 64 surrounding the threaded block aperture 62, to provide a counter bore. A proximate wall portion of the threaded block aperture 66 is threaded, to cooperatively engage the threaded shaft 46 of the threaded fastener 32. A thread 68 in the threaded wall 66 also includes a root 70 and a peak 72. Preferably, the threads 46, 68 have a different thread profile. A distal portion of the threaded block aperture 74 is not threaded, to receive the tip 54 of the threaded fastener 32, and includes a cylindrically shaped portion 76 adjoining a conically shaped portion 78. An end of the threaded block 58 known as a threaded block cap 80 is solid.

Figure 3A:
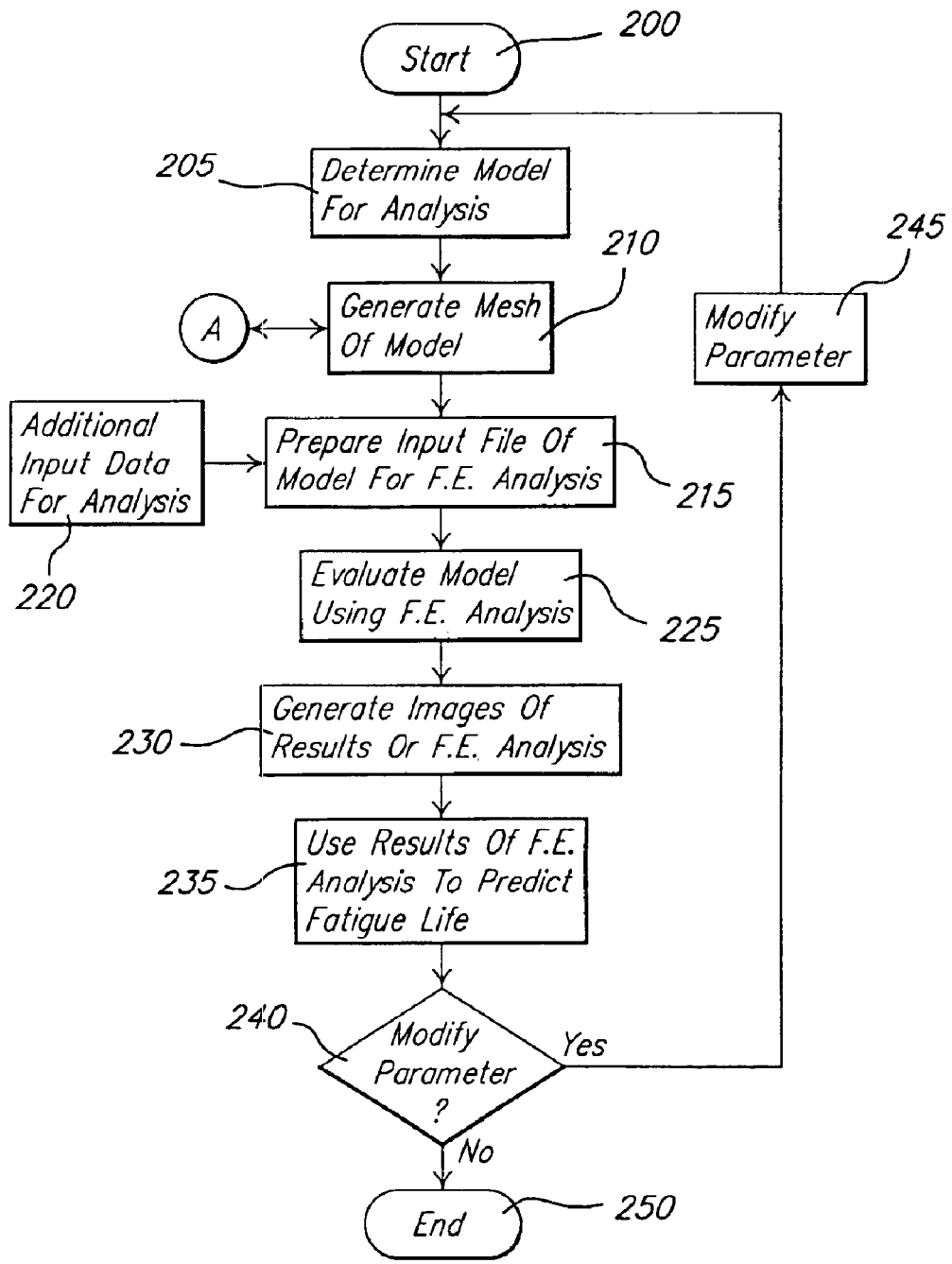
FIGS. 3A through 3R are flowcharts of a system and method of generating a finite element mesh for a threaded fastener and joining structure, according to the present invention.

Referring to FIG. 3A, a flowchart of a system and method of generating a finite element mesh for a threaded fastener and a joining structure assembly 30, according to the present invention, is illustrated. Advantageously, the system and method embeds knowledge, guidelines and lessons learned from design, engineering and manufacturing experts to interactively mesh a threaded fastener 32 and joining structure 34. The methodology begins in bubble 200, when it is called for by the user 26. The methodology advances to block 205.

In block 205, the user 26 determines a type of fastener and joining structure assembly 30, for the threaded fastener 32, clearance hole block 56 and threaded block 58 of this example. Advantageously, a portion of the joining structure 34 is used to build a sub-model of the overall or global joining structure, which in this example is the end cap and engine block, to improve the accuracy of the mesh. The size of the global model is large in terms of degrees of freedom in analysis calculations, and can be meshed using a coarse mesh and by simplifying the behavior of the threaded fastener. The sub model is more accurate since it is a more refined mesh, and uses displacement and thermal boundary conditions on the sub model from the global model analysis. The methodology advances to block 210.

In block 210, the methodology generates a mesh of the model by advancing to circle A of FIG. 3B, to be described. Preferably, a data file containing a mesh of the threaded fastener 32, clearance hole block 56 and threaded block 58 in a format usable for further analysis, is returned from circle A. The methodology advance to block 215.

In block 215, the methodology prepares an input file using the data file containing the mesh of the threaded fastener 32, clearance hole block 56 and threaded block 58 and additional input data from block 220. For example, the input data may include information regarding a material property, or a load or a boundary condition for the threaded fastener 32. The methodology advances to block 225.

In block 225, the methodology uses the input file to evaluate stresses in the model of the threaded fastener 32, clearance hole block 56 and threaded block 58 using a computer aided engineering analytical tool 18, such as finite element analysis. In this example, a commercially available finite element analysis software program such as ABAQUS by Hibbett, Karlsson & Sorenen, Inc. is utilized. The output of the finite element analysis software program includes representative data concerning the stress, strain, contact pressures, and other state variables of the threaded fastener and joining structure assembly 30. The methodology advances to block 230.

In block 230, the methodology presents the output of the finite element analysis to the user 26 in a usable format, such as by using a visualization software program. An example of a commercially available visualization software program is EnSight by Computational Engineering International, or IDEAS by Structural Dynamics Research Corporation. The visualization software program generates images of the threaded fastener and joining structure assembly 30 to indicate stress concentrations, such as by contour curves of stress or strain, contact pressures and other state variables. The methodology advances to block 235.

In block 235, the methodology uses the output of the finite element analysis to predict a fatigue life of the model of the threaded fastener and joining structure assembly 30. For example, a software program such as FEMFAT by Steyr-Daimler can be used to perform fatigue calculations on the stress fields to predict the life of the threaded fastener 32, clearance hole block 56 or threaded block 58 under various conditions. The methodology advances to diamond 240.

In diamond 240, the user 26 determines if the model of the threaded fastener and joining structure assembly 30 should be modified based on the output of the finite element analysis or the fatigue analysis. For example, if the fatigue life of the threaded fastener 32 is too short or the stresses too high, a parameter describing the threaded fastener 32 can be modified. Similarly, if the stress fields and fatigue life are acceptable, another material for the clearance hole block 56 or threaded block 58 can be evaluated for weight savings purposes.

If the model should be modified, the methodology advances to block 245. In block 245, a parameter describing the model is modified and the methodology returns to block 205 and continues. Returning to diamond 240, if the user 26 determines not to modify the model, the methodology advances to bubble 250 and ends. Advantageously, the methodology can be used to rapidly generate a finite element mesh, analyze a model, and consider design variations without building a physical prototype.

Referring to FIG. 3B, the methodology generates a mesh of the model beginning in circle A, shown at 275, and continuing to block 280. In block 280, the user 26 specifies parameters describing the threaded fastener 32, and clearance hole block 56 and threaded block 58. An example of parameters for describing the threaded fastener 32 include a height, width and geometric progression factor for a mesh in the bolt head 36, shoulder 42, shaft 38 and tip 54. Other examples of parameters are a thread pitch, profile type, length, diameter and number of revolutions for thread growth.

An example of a parameter for describing the threaded block 58 includes a counter bore depth, diameter and geometric progression factors. Another example of a parameter for the describing threaded block 58 includes block shape and a profile type, length, diameter and number of revolutions for thread growth of the threaded portion 46. An example of a parameter for describing the clearance hole block 56 includes block shape and aperture size and location. The methodology advances to block 285.

In block 285, the methodology advances to Circle B, to be described with respect to FIG. 3C, to create a mesh for the threaded fastener 32. The methodology advances to block 290. In block 290, the methodology advances to circle C, to be described with respect to FIG. 3D, and creates a mesh for the clearance hole block 56. The methodology advances to block 295. In block 295, the methodology advances to circle D, to be described in FIG. 3E, and creates a mesh for the threaded block 58. The methodology advances to block 300.

In block 300, the methodology checks the data for the mesh of the threaded fastener 32, clearance hole block 56 and threaded block 58. For example, the mesh may be compared to a predetermined rule maintained in the knowledge based engineering library 12. An example of a rule is whether data is consistent. Another example is if all element faces have an approximate regular shape. Still another is if solid elements have a positive volume. The methodology advances to block 305.

Figure 4A:
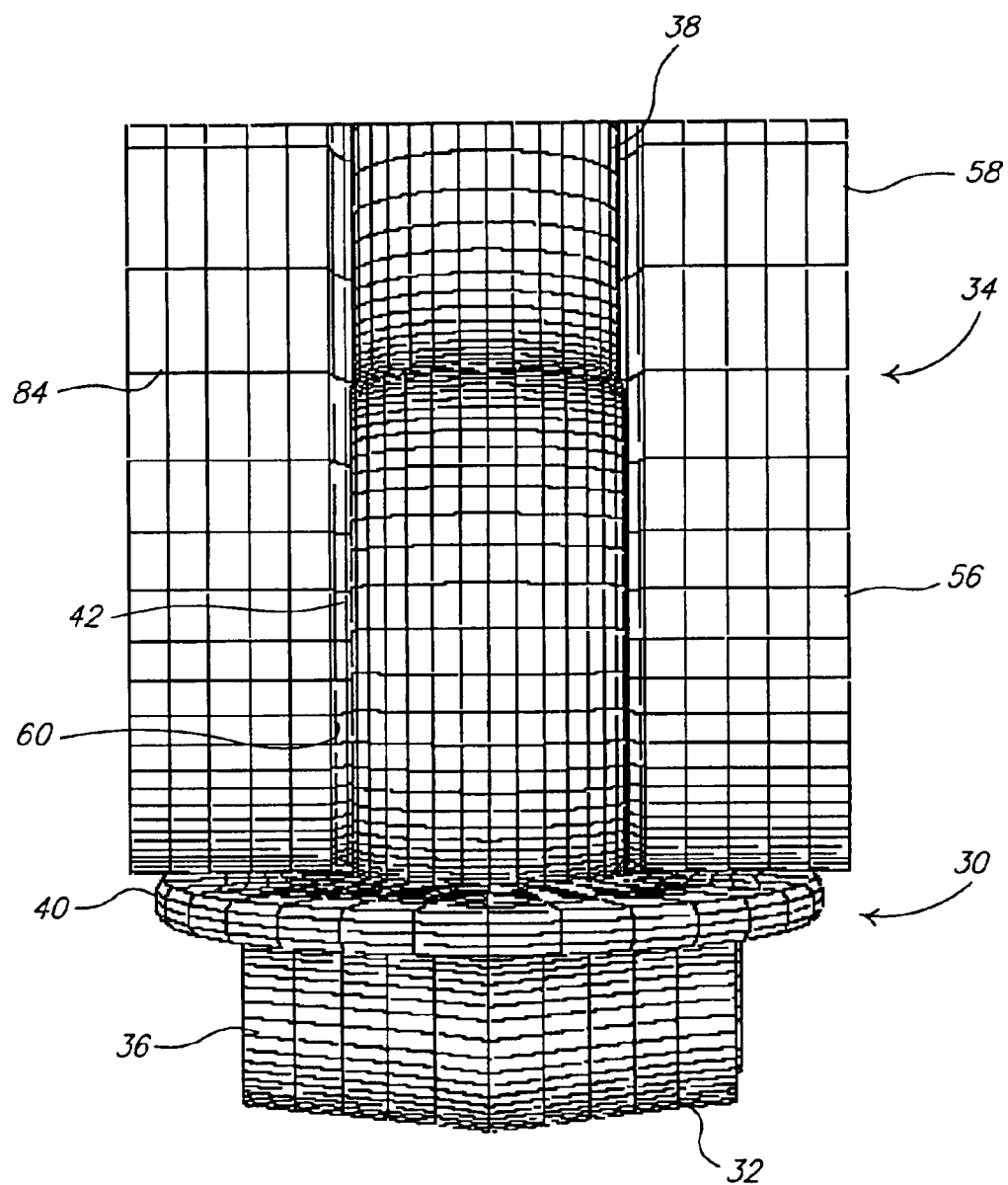
Figure 4C:
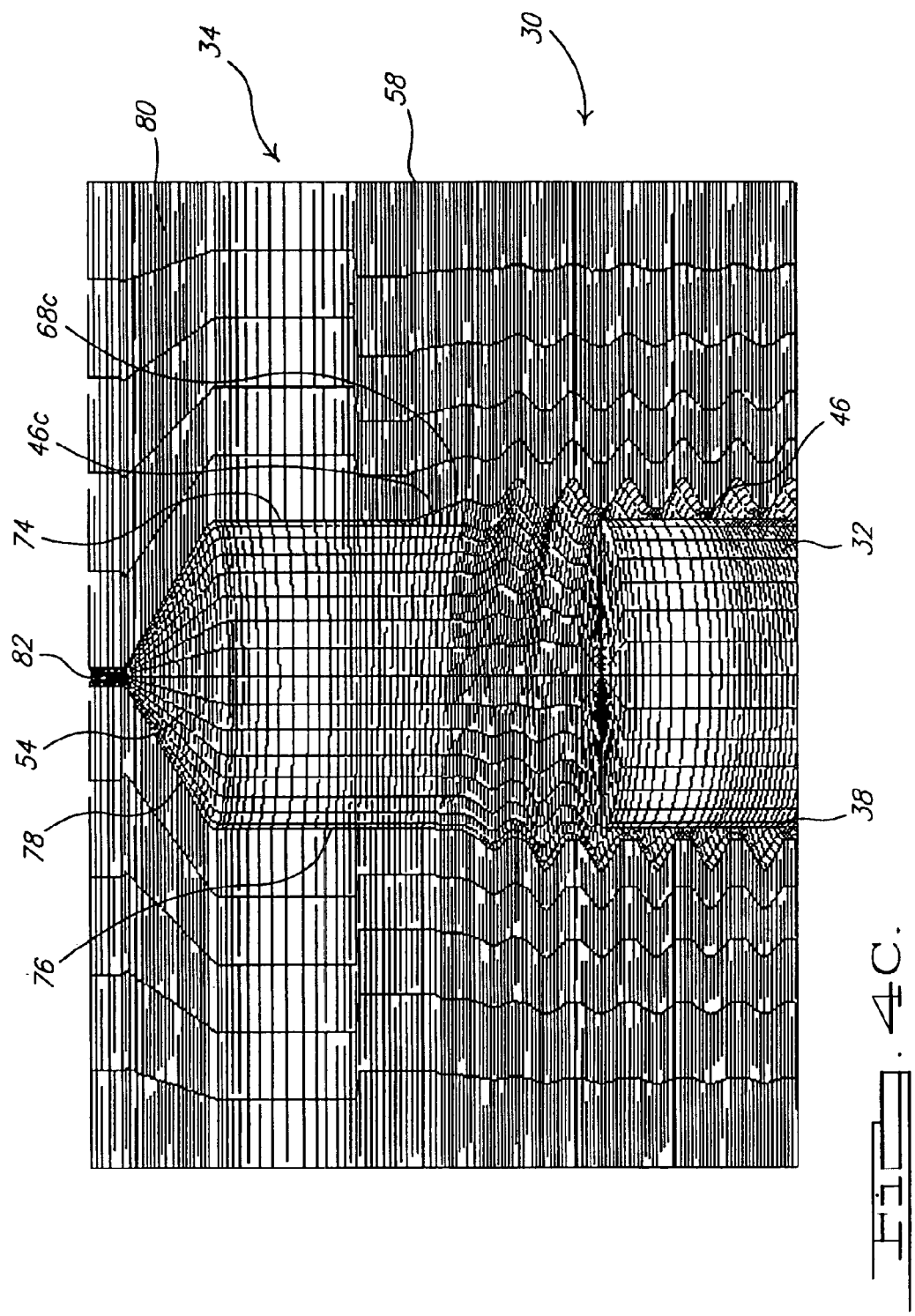

In block 305, the methodology creates an output file containing a mesh model of the threaded fastener 32 disposed within the joining structure 34. The output file contains the meshes for the threaded fastener 32, clearance hole block 56 and threaded block 58. The methodology advances to circle 310 and returns to the entry point. An example of a mesh model of a threaded fastener and joining structure assembly 30 is illustrated in FIGS. 4A through 4C. It should be appreciated that the model is presented in sections for visualization purposes.

Referring to FIG. 3C, the methodology defines a mesh for the threaded fastener 32 by meshing each geometric entity of the threaded fastener 32 separately. In this example, the geometric entities of the threaded fastener 32 include the head 36, flange 40, shoulder 42, shaft 38, thread 40 and tip 54 portions respectively. The methodology advances to block 330.

Figures 3D, 3E:
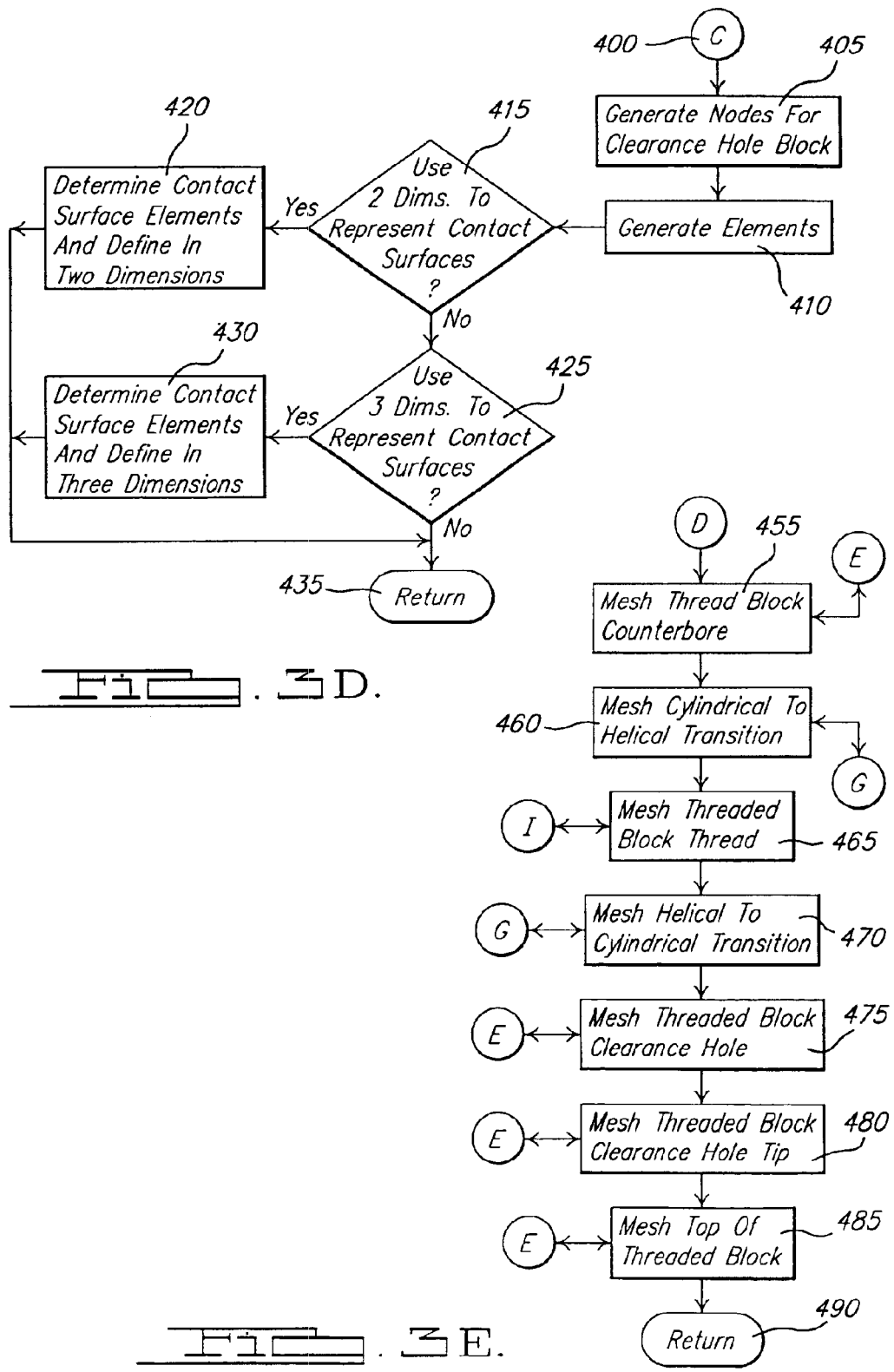
Figure 3F:
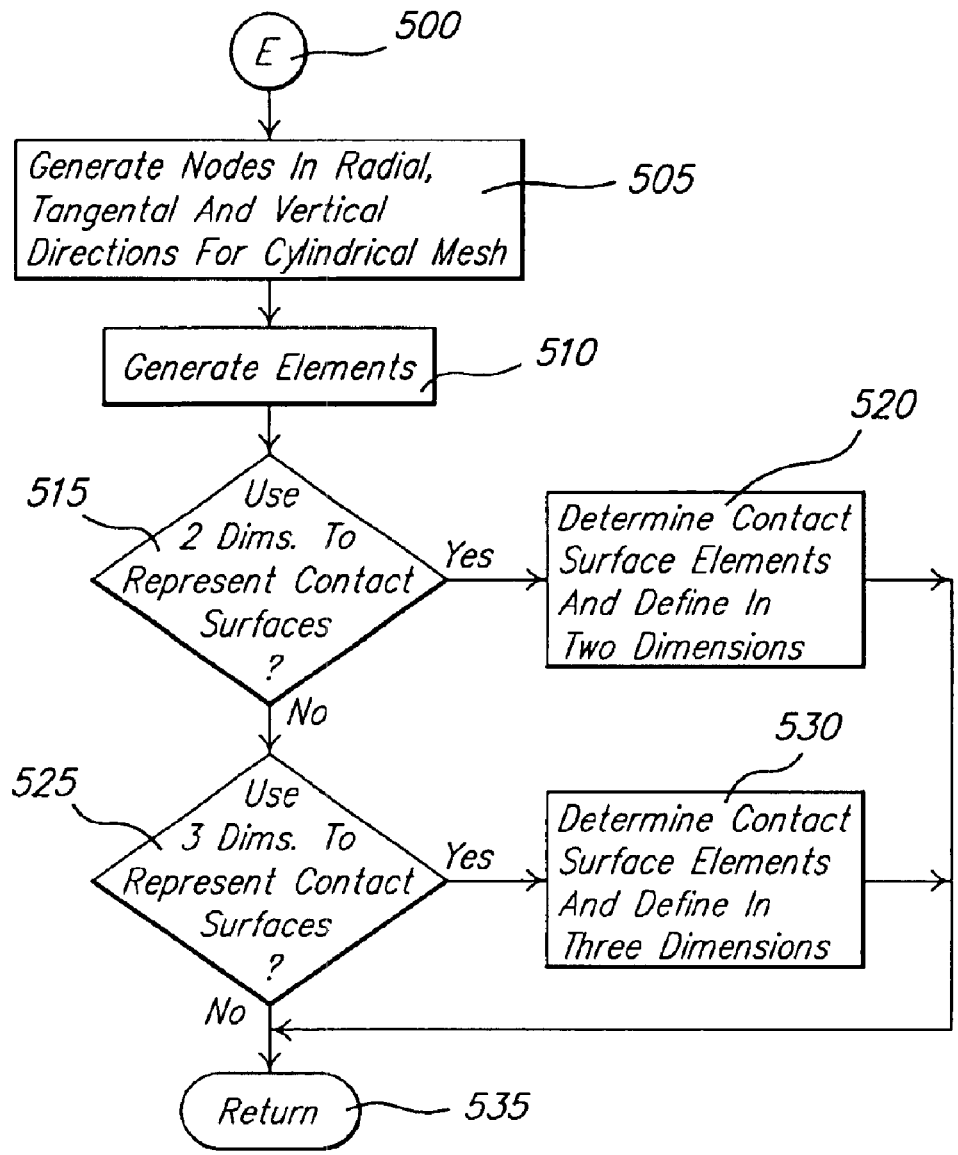

In block 330, the methodology advances to circle E, to be described with respect to FIG. 3F, to mesh the head 36. The methodology advances to block 335 and advances to circle E in FIG. 3F to mesh the flange 40. The methodology advances to block 340 and advances to circle E in FIG. 3F to mesh the shoulder 42. The methodology advances to block 345 and advances to circle F shown in FIG. 3G, to be described, to mesh the shaft 38.

Figure 3G:
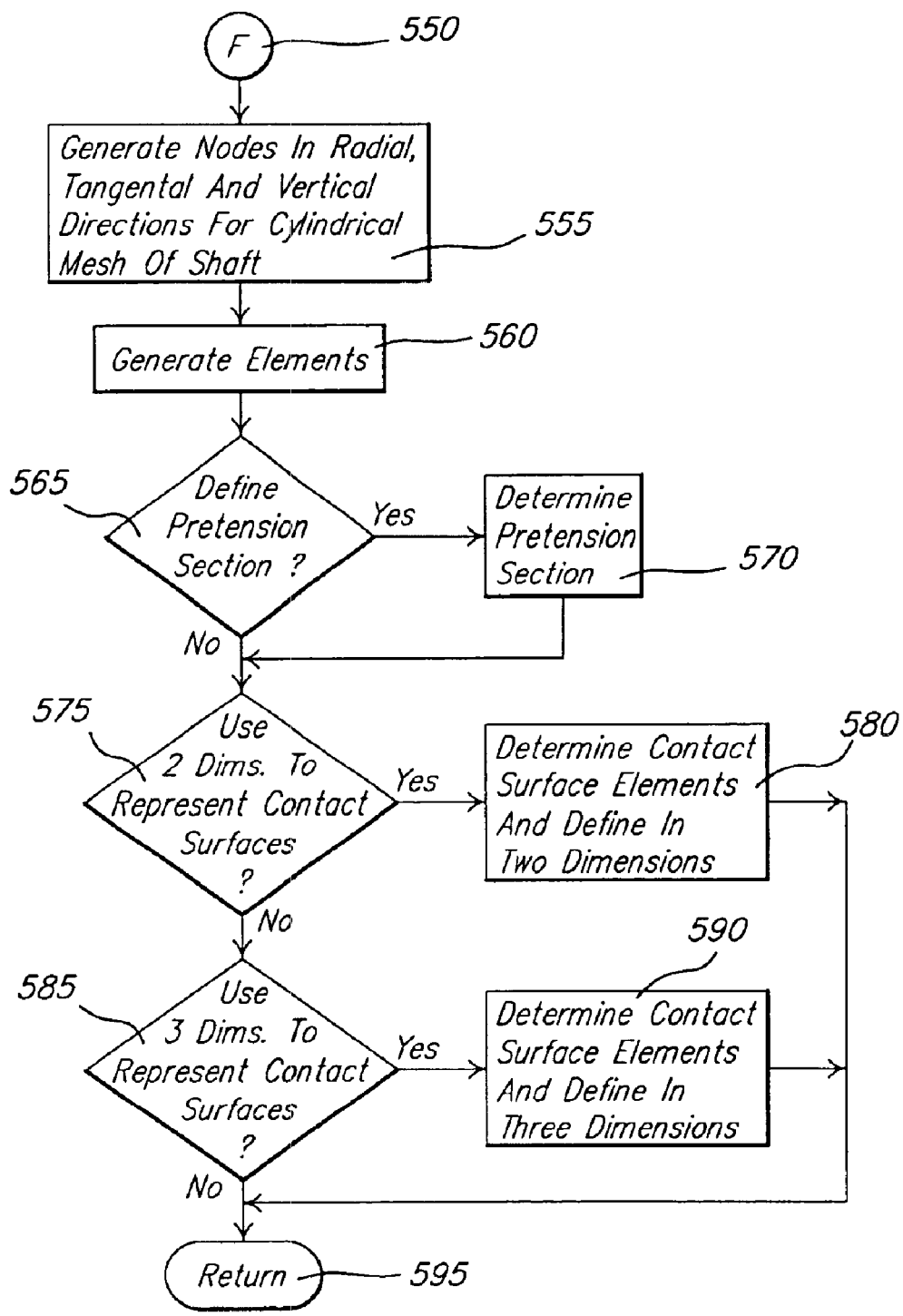
Figure 3H:
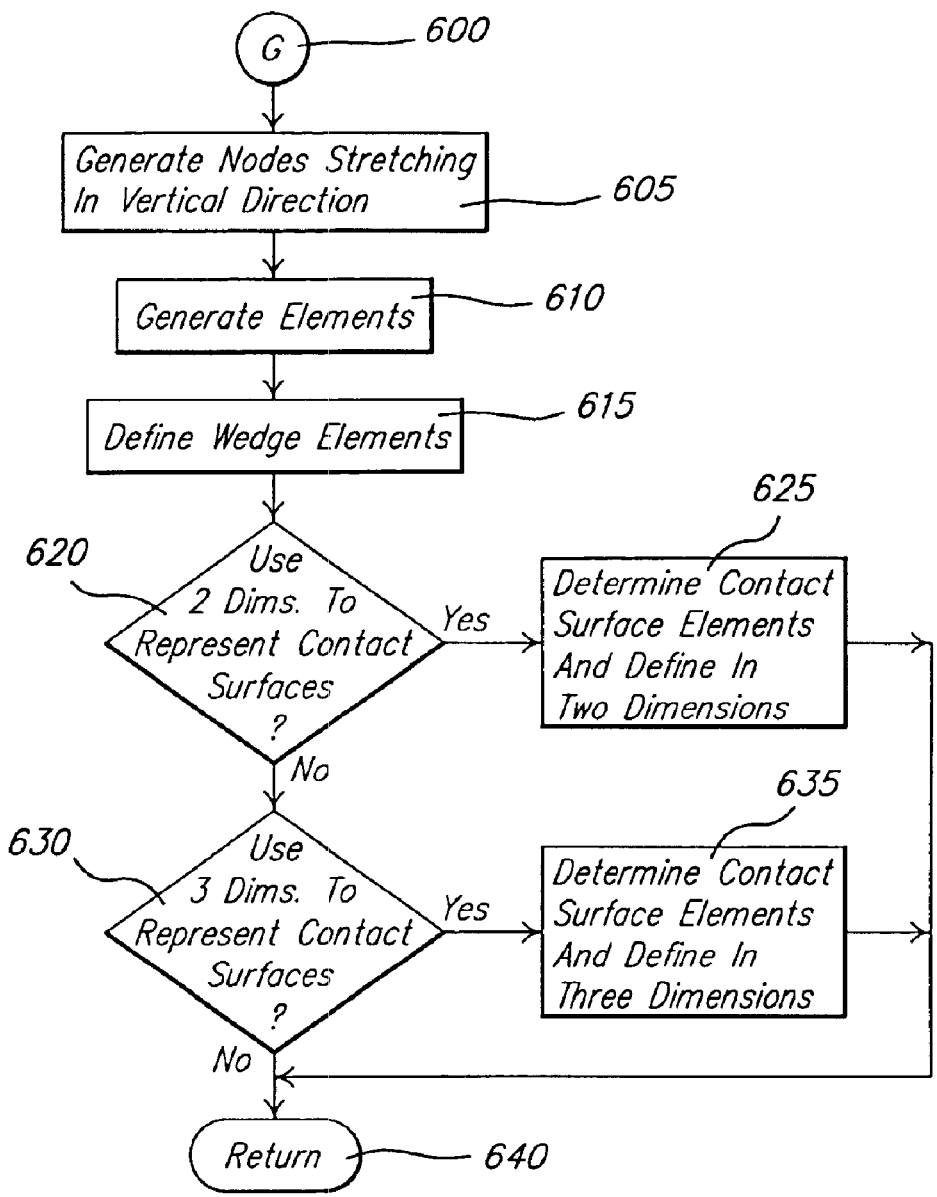
Figure 5A:
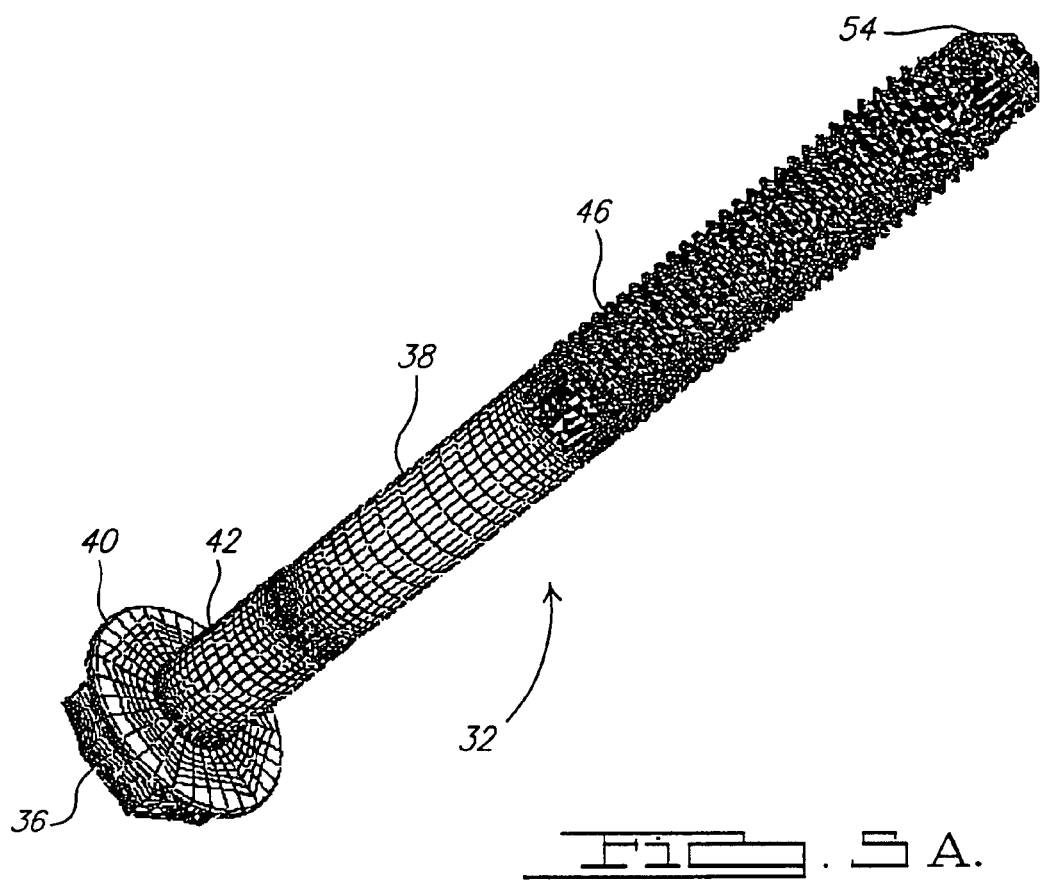
FIGS. 5A through 5E are examples of a uniform finite element mesh for a threaded fastener according to the system and method of FIGS. 3A through 3R.

The methodology advances to block 350 and advances to circle G shown in FIG. 3H to be described, to mesh a cylindrical to helical transition between the unthreaded portion of the shaft 44 and the threaded portion 46 of the shaft 38. The methodology advances to block 355 and advances to circle H shown in FIG. 3I to be described, to mesh the thread 48. The methodology advances to block 360 and advances to circle G shown in FIG. 3H, to mesh a helical to cylindrical transition between the threaded portion 46 of the shaft 38 and the tip 54 of the shaft 38. The methodology advances to block 365 and advances to circle E shown in FIG. 3F, to mesh the tip 54. An example of a mesh of the threaded fastener 32 is illustrated in FIG. 5A. The methodology advances to bubble 370 and returns to the entry point.

Referring to FIG. 3D, the methodology generates a mesh for the clearance hole block 56 as shown in FIGS. 4A and 4B. The methodology begins in circle C shown at 400 and continues to block 405. Preferably, the clearance hole block 56 is represented by a cylinder, and a cylindrical meshing technique is used to generate the mesh. In block 405, the methodology generates nodes for the clearance hole block. For example, a system of nodes are arranged in space in the x, y and z coordinate directions using a combination of linear and geometric mathematical equations, as is known in the art. By defining a distance between the nodes in the x, y and z directions of the cylindrical coordinate system, the nodal positions for a node are determined in a sequential manner. The methodology advances to block 410.

In block 410, the methodology defines elements by interconnecting sets of nodes to create an element. For example, the nodes are interconnected in a varying numerical sequence and identified, such as by assigning a number, to indicate which nodes are associated with which element. The methodology advances to diamond 415.

In diamond 415, the user 26 determines whether to represent a contact surface shown at 84 in 2-dimensions. If the user 26 determines to represent a contact surface 84 in 2-dimensions, the methodology advances to block 420. In block 420, the user 26 selects areas of the model that are in contact, and the methodology defines the contact area 84 in two dimensions. Examples of contact areas 84 include an interface between the clearance hole block 56 and threaded block 58. Another contact area 84 is between a flange 40 of the threaded fastener 32 to a surface of the clearance hole block 56. The methodology advances to bubble 435 and returns.

Referring back to diamond 415, if the user determines not to represent a contact surface 84 2-dimensionally, the methodology advances to diamond 425. In diamond 425, the user 26 determines whether to represent a contact surface in 3-dimensions. If the user 26 determines to represent a contact surface in 3-dimensions, the methodology advances to block 420 and the user 26 selects areas of the model that are in contact, and the methodology defines the selected contact surface 84 in three dimensions. The methodology advances to bubble 435 and returns. Returning to diamond 425, if the user 26 determines not to represent the contact surface 84 in three dimensions, the methodology advances to bubble 435 and returns to the entry point.

Referring to FIG. 3E, the methodology creates a finite element mesh for the threaded block 58. The methodology begins in circle D, shown at 450, when called for. Advantageously, the methodology generates a mesh for each geometric entity of the threaded block 58 including the counter bore, threaded section, clearance hole, clearance hole tip, and threaded block top as shown in FIGS. 4A through 4C and 6A through 6C. The methodology advances to block 455. In block 455, the methodology generates a mesh of the threaded block counter bore 64. The methodology advances to circle E, to be described in FIG. 3F, to create the mesh of the threaded block counter bore 64. The methodology advances to block 460.

In block 460, the methodology generates a mesh of the cylindrical coordinate system to helical coordinate system transition between the counter bore 64 in the threaded block 58 and the threads 68 in the threaded block 58. The methodology advances to circle G shown in FIG. 3H to be described, to mesh the cylindrical to helical transition. The methodology advances to block 465.

In block 465, the methodology generates a mesh of the threaded block thread 68. The methodology advances to circle I to be described in FIG. 3J to create the mesh of the threaded block thread 68. The methodology advances to block 470. In block 470, the methodology generates a mesh of the helical to cylindrical transition between the threaded block threads 68 and the distal portion of the threaded block aperture 74. The methodology advances to circle G shown in FIG. 3H to be described, to mesh the helical to cylindrical transition. The methodology advances to block 475.

In block 475, the methodology generates a mesh of the cylindrical portion of the distal portion of the threaded block aperture 74. The methodology advances to circle E to be described in FIG. 3F to create the mesh of the cylindrical portion 76 of the distal portion of the threaded block aperture 74. The methodology advances to block 480. In block 480, the methodology generates a mesh of the conical portion 78 of the distal portion of the threaded block aperture 74. The methodology advances to circle E to be described in FIG. 3F to create the mesh of the threaded block conical portion 78 of the distal portion of the aperture 74. The methodology advances to block 485.

In block 485, the methodology generates a mesh of the cap 80 of the threaded block 58. Preferably, the cap 80 of the threaded block 58 is a solid structure. The methodology advances to circle E to be described in FIG. 3F to create the mesh of the cap 80 of the threaded block 58. The methodology advances to bubble 490 and returns to the entry point.

Referring to FIG. 3F, the methodology generates a mesh for portions of the threaded fastener 32 and threaded block 58 that can be geometrically represented by a cylinder. The methodology begins in circle E shown at 500 and continues to block 505. Preferably, a cylindrical meshing technique, as described with respect to FIG. 3D, is used to generate the mesh. In block 405, the methodology generates nodes in the radial, tangential and vertical directions for a cylindrical mesh. For example, a system of nodes are arranged in space in the x, y and z coordinate directions using a combination of linear, non-linear, step function and geometric progressions mathematical equations, as is known in the art. The methodology advances to block 510.

In block 510, the methodology generates elements by interconnecting sets of nodes to create an element. For example, the nodes are interconnected in a varying numerical sequence and identified, such as by assigning a number, to indicate which nodes are associated with which element. The methodology advances to diamond 515.

In diamond 515, the user 26 determines whether to represent a contact surface 84 as previously described in 2-dimensions. If the user 26 determines to represent a contact surface 84 in 2-dimensions, the methodology advances to block 520. In block 520, the user 26 selects areas of the model that are in contact, and the methodology defines the selected contact surface 94 in two dimensions. The methodology advances to bubble 535 and returns.

Referring back to diamond 515, if the user 26 determines not to represent a contact surface 2-dimensionally, the methodology advances to diamond 525. In diamond 525, the user 26 determines whether to represent a contact surface 84 in 3-dimensions. If the user 26 determines to represent a contact surface 84 in 3-dimensions, the methodology advances to block 530 and the user 26 selects areas of the model that are in contact, and the methodology defines the selected contact surface 84 in three dimensions. The methodology advances to bubble 535 and returns. Returning to diamond 525, if the user 26 determines not to represent the contact surface 84 in three dimensions, the methodology advances to bubble 535 and returns to the entry point.

Referring to FIG. 3G, the methodology generates a mesh for the unthreaded portion of the shaft 44 for the threaded fastener 32. The methodology begins in circle F shown at 550 and continues to block 555. Preferably, the unthreaded portion of the shaft for the threaded fastener 32 is geometrically represented by a cylinder, and a cylindrical meshing technique is used to generate the mesh as described with respect to FIG. 3D. In block 555, the methodology generates nodes for the shaft 38 in the radial, tangential and vertical directions for a cylindrical mesh. For example, a system of nodes are arranged in space in the x, y and z coordinate directions using a combination of linear, non-linear, step function and geometric progression mathematical equations, as is known in the art. The methodology advances to block 560.

In block 560, the methodology generates elements by interconnecting sets of nodes to create an element. For example, the nodes are interconnected sequentially and identified, such as by assigning a number, to identify which nodes are associated with which element. The methodology advances to diamond 565.

In diamond 565, the user 26 determines whether to define a pretension section in the shaft 38 that has a preload. If the user 26 determines to define a pretension section, the methodology advances to block 570. In block 570, the user 26 identifies the pretension portion of the shaft 38. For example, the user 26 may specify a load on a portion of the shaft 38, such as the midpoint. The methodology advances to diamond 575 and continues. If the user 26 determines not to define a pretension section, the methodology advances to diamond 575 and continues.

In 575, the user 26 determines whether to represent a contact surface 84 in 2-dimensions. If the user determines to represent a contact surface 84 in 2-dimensions, the methodology advances to block 580 and the user 26 selects a surface of the model that are in contact, and the methodology defines the selected contact surface 84 in two dimensions. The methodology advances to bubble 595 and returns.

Referring back to diamond 575, if the user 26 determines not to represent a contact surface 84 2-dimensionally, the methodology advances to diamond 585. In diamond 585, the user 26 determines whether to represent a contact surface 84 in 3-dimensions. If the user 26 determines to represent a contact surface 84 in 3-dimensions, the methodology advances to block 590 and the user 26 selects areas of the model that are in contact, and the methodology defines the contact surfaces 84 in 3-dimensions. The methodology advances to bubble 595 and returns. Returning to diamond 585, if the user 26 determines not to represent the contact surface 84 in three dimensions, the methodology advances to bubble 595 and returns.

Figure 5B:
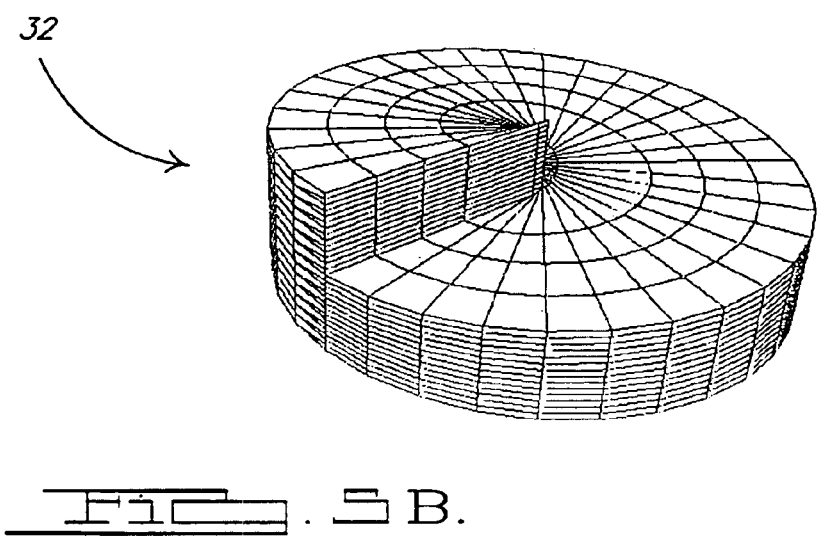

Referring to FIG. 3H, the methodology generates a mesh for the cylindrical to helical transition between a non-threaded portion and a first thread 46a of the threaded portion 46 of the threaded m fastener 32 or threaded block 58. An example of a cylindrical to helical transition in the threaded. fastener 32 is illustrated in FIG. 5B. It should be appreciated that the helical to cylindrical transition is a reverse process of the cylindrical to helical transition, as illustrated for the threaded fastener 32 in FIG. 5E. Advantageously, the vertical height between the nodes, represented by DZ, changes as a function of the sweep around the axis in the vertical axis in the DY direction. As the position of the nodes are generated, they move upwards such that after one revolution, the last set of nodes is twice as high as the first set of nodes. This yields a part that is flat on the bottom in the cylindrical coordinate system and "lock washer" shaped in the helical coordinate system. The methodology begins in circle G shown at 600 and continues to block 605. Preferably, the generated mesh provides a smooth transition from a cylindrical coordinate system to helical coordinate system. In block 605, the methodology generates nodes for the transition part by stretching the hexahedral elements in the vertical direction. For example, the nodes are arranged in space in the x, y and z coordinate directions using a combination of linear, non-linear, step function and geometric progression mathematical equations, as is known in the art. The methodology advances to block 610.

In block 610, the methodology generates elements by interconnecting each set of nodes in a stretched position to create an element. For example, the nodes are interconnected in a varying numerical sequence and identified, such as by assigning a number, to indicate which nodes are associated with which element. When the revolution is complete, the hexahedral elements now fill twice the thread pitch. The methodology advances to block 615. In block 615, wedge elements are interleaved into the end of the revolution to allow one half of the transition layers to match with the start of the transition and the other half to match a helical mesh whose elements match the original thickness of the structure. The methodology advances to diamond 620.

In diamond 620, the user 26 determines whether to represent a contact surface 84 as previously described in two dimensions. If the user 26 determines to represent a contact surface 84 in 2-dimensions, the methodology advances to block 625 and the user 26 selects areas of the model that are in contact, and the methodology defines the selected contact surfaces in two dimensions. The methodology advances to bubble 640 and returns.

Referring back to diamond 620, if the user 26 determines not to represent a contact surface 84 2-dimensionally, the methodology advances to diamond 630. In diamond 630, the user 26 determines whether to represent a contact surface 84 in 3-dimensions. If the user 26 determines to represent a contact surface 84 in 3-dimensions, the methodology advances to block 635 and the user 26 selects areas of the model that are in contact, and the methodology defines the selected contact surface 84 in three dimensions. The methodology advances to bubble 640 and returns. Returning to diamond 630, if the user determines not to represent the contact surface 84 in three dimensions, the methodology advances to bubble 640 and returns.

Figure 3I:
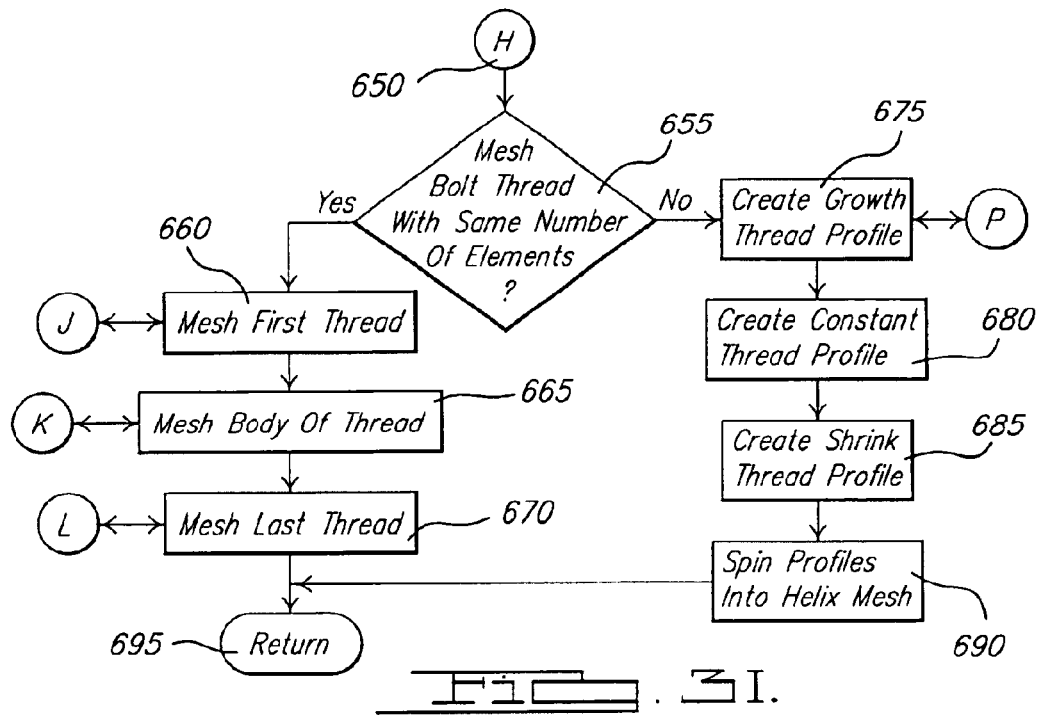

Referring to FIG. 3I, the methodology creates a mesh of the thread 46 when called for. The methodology begins in circle H, shown at 650 and continues to diamond 655. In diamond 655, the user 26 determines whether to generate a mesh of the threads using a uniform number of elements, or a non-uniform number of elements by adding elements in areas of known stress concentrations. If the user 26 determines to mesh the threads with a uniform number of elements, the methodology advances to block 660.

Figure 5C:
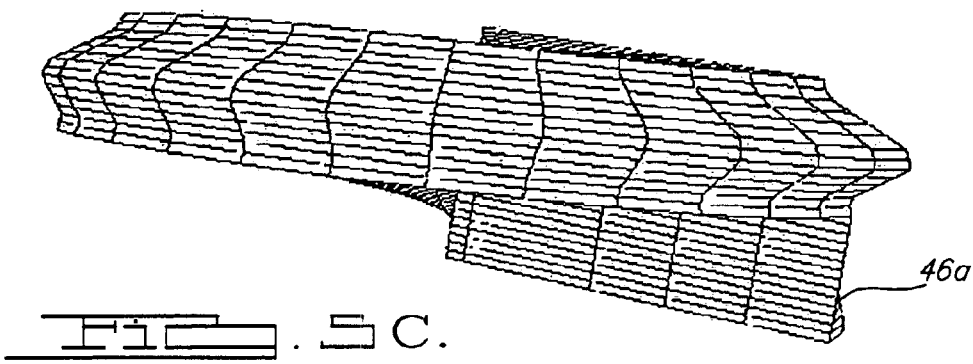
Figure 5D:
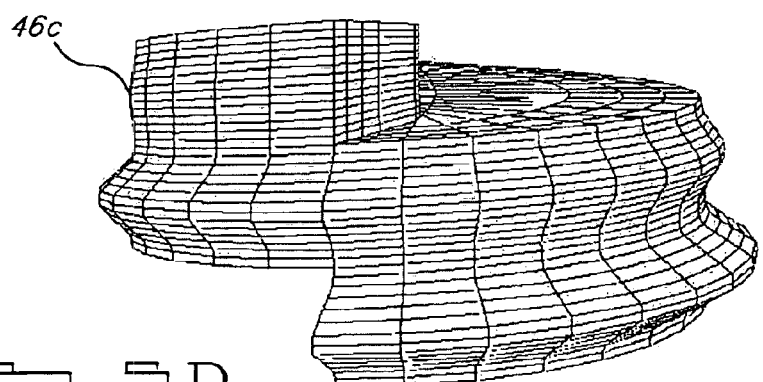
Figure 5E:
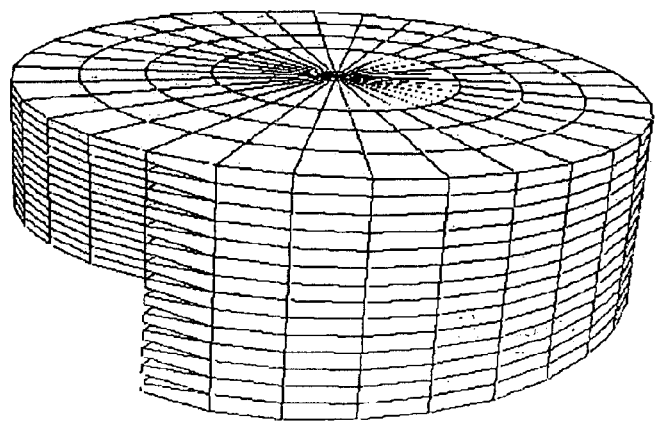

In block 660, the methodology generates a uniform mesh of the thread 46 by first creating a mesh of a first thread 46*a* of the threaded portion 46 of the threaded fastener 32 using progressively larger percentages of the elements in a radial direction within a helical coordinate system as shown in FIG. 5C. As the nodes grow in the radial direction, they must rise in the vertical direction to maintain the helical shape to form the actual thread profile. The mesh is stretched in the radial direction as a function of height. It should be appreciated that an axial cross-section of a uniform mesh will demonstrate a constant number of rows and columns. The mesh pattern is stretched to follow the thread profile. Each successive column of elements is stretched by a smaller percentage of a full thread.

Figure 3J:
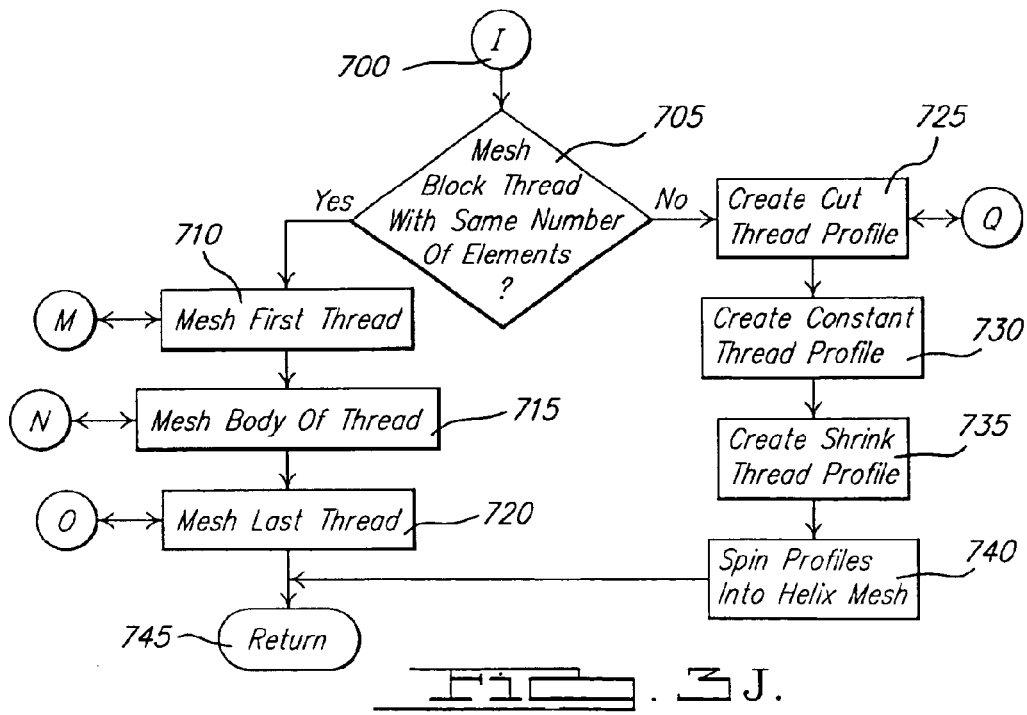
Figure 3K:
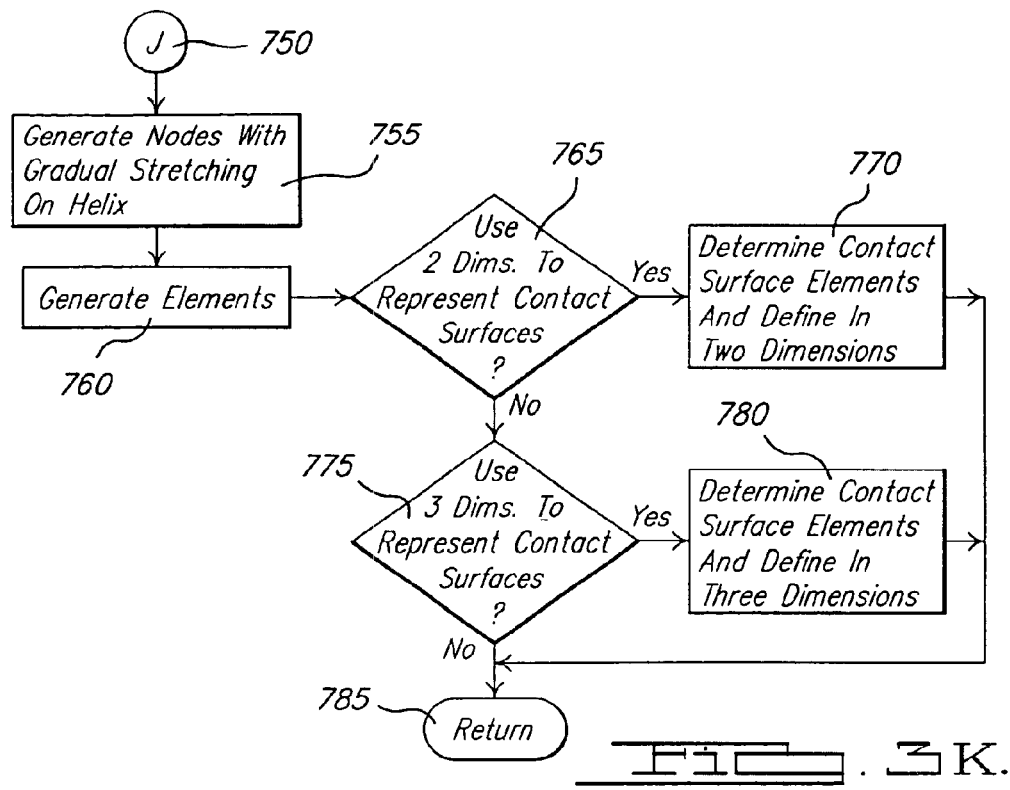

The methodology advances to circle J, to be described with respect to FIG. 3K to generate the mesh of the first thread 46*a*. The methodology advances to block 665 and generates a mesh of the thread body 46*b*. The methodology advances to circle K, to be described with respect to FIG. 3L to generate the mesh of the thread body 46*b*. The methodology advances to block 670 and generates a mesh of the last thread 46*c* as shown in FIG. 5O. The methodology advances to circle L, to be described with respect to FIG. 3M, to generate the mesh of the last thread 46*c*. The methodology advances to bubble 695 and returns.

Returning to diamond 655, if the user 26 determines to mesh the threads with a non-uniform number of elements, the methodology advances to block 675. An example of a non-uniform mesh is illustrated in FIGS. 6A through 6C. Advantageously, the mesh is denser along the surface of the thread without changing the number of elements of the interior portion of the thread that form the cylindrical to helical transition, by making a transition zone in three directions simultaneously. In block 675, the methodology creates a growth thread profile. It should be appreciated that a thread profile is a vertical cross section through a thread between columns of hexahedral elements. In this example, six rows of pentahedral elements have been added over the course of thread growth. The methodology advances to Circle P to be described in FIG. 3Q to create a growth thread profile. The methodology advances to block 680.

In block 680, the methodology creates a mesh for the middle bolt threads 46*b* using a constant thread profile. It should be appreciated that the last growth profile for the threaded portion 46 is the size and shape of the full thread. This profile is replicated a number of times corresponding to the number of profiles per revolution and the length of the thread. Hexahedral elements are created between 15 successive profiles. A constant growth profile is illustrated in FIG. 6A to show a cross section of a full thread. This cross-section will be repeated for the entire length of the full size thread. The methodology advances to block 685.

In block 685, a mesh is created for the last thread 46*c* of the threaded fastener 32. Preferably, the shrink thread profile corresponds directly with the growth profiles for the first thread 46*a*. It should be appreciated that there are the same number of growth profiles as shrink profiles, only the order is reversed. The primary difference is that the shrink profile transition is from a root diameter of the threaded fastener 32 to the peak diameter. The methodology advances to block 690.

In block 690, the methodology spins the growth profiles, constant thread profiles and shrink profiles into a helix, representative of their final position. Preferably, each profile is in the X-Z plane. Thus, for each successive profile, the nodes of the profile are offset another step along the Z-axis, and rotated another step around that axis.

Referring to FIG. 3J, the methodology creates a mesh of the threaded block thread 68 when called for. The methodology begins in circle I, shown at 700 and continues to diamond 705. In diamond 705, the user 26 determines whether to generate a mesh of the threads 68 using a uniform number of elements, or using a non-uniform number of elements by adding elements in areas of known stress concentrations, as described with respect to the threaded fastener 32. If the user 26 determines to mesh the block threads 68 with a uniform number of elements, the methodology advances to block 710.

In block 710, the methodology generates a uniform mesh of the block threads 68 by first creating a mesh of a first thread 68a of the threaded portion of the block 38 using gradual stretching of the helical elements on a manner similar to the first thread 46a for the threaded fastener 32. The methodology advances to circle M, to be described with respect to FIG. 3N to generate the mesh of the first thread 68a. The methodology advances to block 715 and generates a mesh of the thread body 68b. The methodology advances to circle N, to be described with respect to FIG. 3O to generate the mesh of the thread body s 68b. The methodology advances to block 720 and generates a mesh of the last thread 68c. The methodology advances to circle O, to be described with respect to FIG. 3P, to generate the mesh of the last thread 68c. The methodology advances to bubble 745 and returns to the entry point.

Returning to diamond 705, if the user 26 determines to mesh the threads 48 with a non-uniform number of elements, the methodology advances to block 725. In block 725, the methodology creates a cut thread profile for the first thread 68a in the threaded block 58. It should be appreciated that a thread profile is a vertical cross section through a thread between columns of hexahedral elements. The methodology advances to circle Q to be described in FIG. 3R to create a cut thread profile. The methodology advances to block 730.

In block 730, the methodology creates a constant thread profile for the thread body 68b of the threaded block 58. It should be appreciated that the last growth profile for the threaded portion is the size and shape of the full thread. This profile is replicated a number of times corresponding to the number of profiles per revolution and the length of the thread. Hexahedral elements are created between successive profiles. The methodology advances to block 735.

In block 735, a mesh is created for the last thread 68c of the threaded block 58 using a shrink thread profile. Preferably, the shrink thread profile corresponds directly with the growth profiles for the first thread 68a. It should be appreciated that there are the same number of growth profiles as shrink profiles, only the order is reversed. The primary difference is that the shrink profile transitions from a root diameter of the thread 68 to the clearance hole diameter. The methodology advances to block 740.

In block 740, the methodology spins the growth profiles, constant thread profiles and shrink profiles into a helix, representative of their final position for the threaded block 58. Preferably, each profile is created in the X-Z plane. Thus, for each successive profile, the nodes of the profile are offset another step along the Z-axis, and rotated another step around that axis.

Referring to FIG. 3K, the methodology generates a mesh for the first thread 46b of the threaded fastener 32, that can be geometrically represented by a helix as shown in FIG. 5C. It should be appreciated that the first thread 46a is "grown" gradually from the shaft 38. A proportion of the thread profile and a proportion of the difference in baselines are added as the nodes are laid out around the vertical axis. The methodology begins in circle J shown at 750 and continues to block 755. Preferably, a helical meshing technique is used to generate the mesh.

In block 755, the methodology generates nodes for the first thread 46a with gradual stretching on the helix. Preferably, successively larger percentages of the full thread profile are used to shape the nodes on the outer surface and the nodes closer to the axis are scaled by a percentage of that shape. For example, the first step of a thread has a profile percentage of zero resulting in no difference in the outer nodes from the shape of a cylinder. The nodes closer to the axis are not changed from those for a cylinder. In successive steps along the first thread 46a, the profile of the thread is scaled by a successively larger percentage in the radial direction to compute a position for the outer nodes. Nodes closer to the axis use the shape of the corresponding outer nodes and scale that shape in the radial direction by the percentage of distance from the axis. Preferably, the first thread 46a grows gradually from a flat surface to a triangular height. The methodology advances to block 760.

In block 760, the methodology generates elements by interconnecting sets of nodes to create an element. For example, the nodes are interconnected in a varying numerical sequence and identified, such as by assigning a number, to indicate which sets of nodes are associated with which element. The methodology advances to diamond 765.

In diamond 765, the user 26 determines whether to represent a contact surface 84 in 2-dimensions. If the user 26 determines to represent a contact surface 84 in 2-dimensions, the methodology advances to block 770 and the user 26 selects areas of the model that are in contact, and the methodology defines the selected contact surfaces 84 in two dimensions. An example of a contact surface 84 is the fastener thread 46 and block thread 68. The methodology advances to bubble 785 and returns.

Referring back to diamond 765, if the user 26 determines not to represent a contact surface 2-dimensionally, the methodology advances to diamond 775. In diamond 775, the user 26 determines whether to represent a contact surface 84 in 3-dimensions. If the user 26 determines to represent a contact surface 84 in 3-dimensions, the methodology advances to block 780 and the user 26 selects areas of the model that are in contact, and the methodology defines the selected contact surfaces 84 in three dimensions. The methodology advances to bubble 785 and returns. Returning to diamond 775, if the user determines not to represent the contact surface in three dimensions, the methodology advances to bubble 785 and returns to the entry point.

Figure 3L:
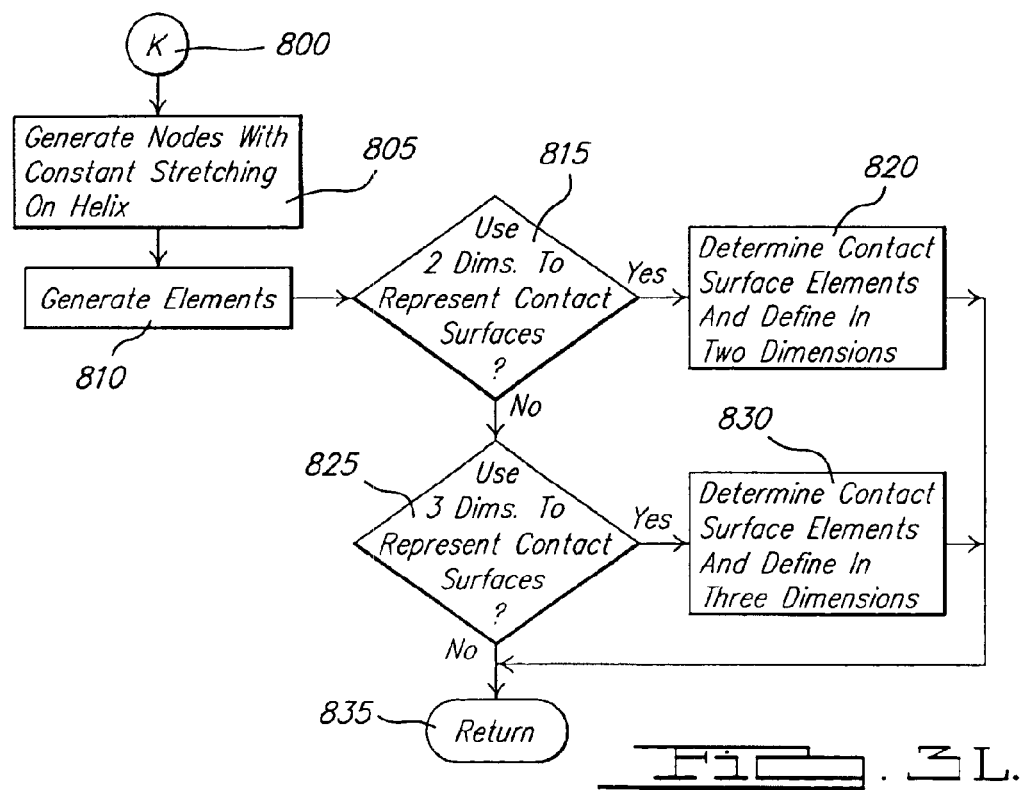

Referring to FIG. 3L, the methodology generates a mesh for the thread body 46b of the threaded fastener 32, that can be geometrically represented by a helix. Preferably, a helical meshing technique is used to generate the mesh as described in FIG. 3K, with constant progressive growth or stretching of the nodes. The methodology begins in circle K shown at 800 and continues to block 805. In block 805, the methodology generates nodes for the thread body 46b by constant progressive growth on the helix by moving nodes upwards to use the helical coordinate system in a constant manner, as is known in the art. The methodology advances to block 810.

In block 810, the methodology generates elements by interconnecting each of the nodes to create an element. For example, the nodes are interconnected in a varying numerical sequence and identified, such as by assigning a number, to indicate which nodes are associated with which element. The methodology advances to diamond 815.

In diamond 815, the user 26 determines whether to represent a contact surface 84 in 2-dimensions. If the user 26 determines to represent a contact surface 84 in 2-dimensions, the methodology advances to block 820 and the user 26 selects areas of the model that are in contact, and the methodology defines the selected contact surfaces 84 in two dimensions. The method advances to bubble 835 and returns.

Referring back to diamond 815, if the user 26 determines not to represent a contact surface 2-dimensionally, the methodology advances to diamond 825. In diamond 825, the user 26 determines whether to represent a contact surface in 3-dimensions. If the user 26 determines to represent a contact surface 84 in 3-dimensions, the methodology advances to block 830 and the user 26 selects areas of the model that are in contact, and the methodology defines the selected contact surfaces 84 in three dimensions. The methodology advances to bubble 835 and returns. Returning to diamond 825, if the user 26 determines not to represent the contact surface 84 in three dimensions, the methodology advances to bubble 835 and returns.

Figure 3M:
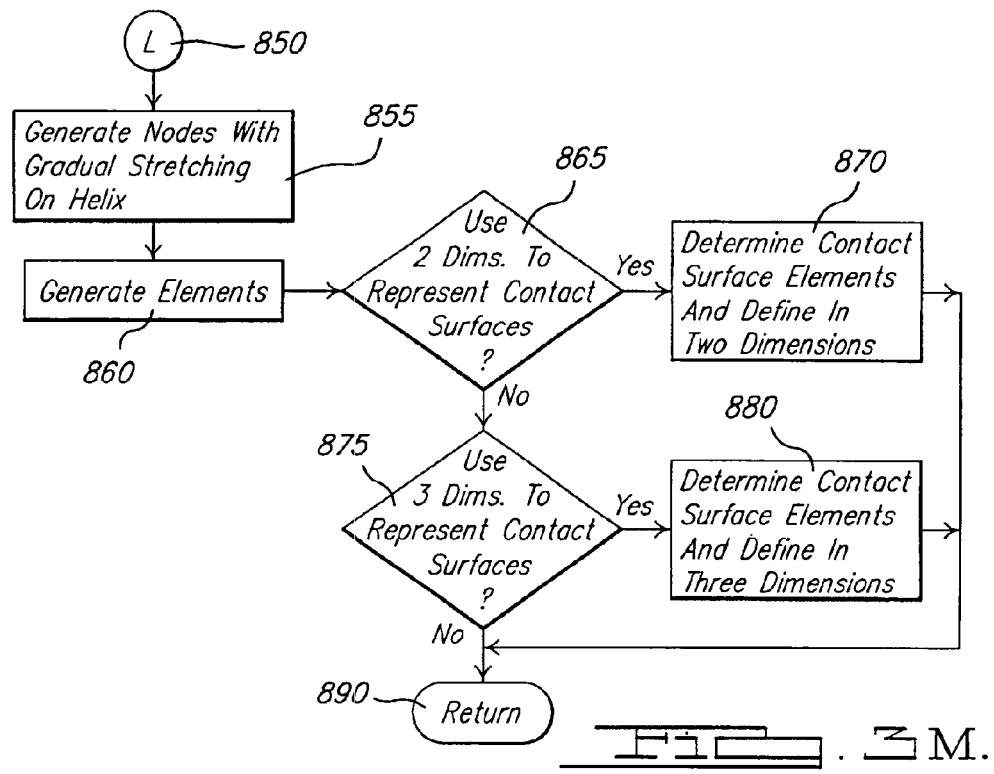

Referring to FIG. 3M, the methodology generates a mesh for the last thread 46c of the threaded fastener 32, that can be geometrically represented by a helix. Preferably, a helical meshing technique is used to generate the mesh as described with respect to FIG. 3K, except that the last thread "shrinks" into the shaft 38. The methodology begins in circle L shown at 850 and continues to block 855. In block 855, the methodology generates nodes for the last thread 46c. For example, nodes are moved radially inwards toward an axis of the threaded fastener 32 by constant shrinking on the helical coordinate system, as is known in the art. Preferably, the last thread 46b shrinks constantly from a triangular height to a flat surface. The methodology advances to block 860.

In block 860, the methodology generates elements by interconnecting sets of nodes to create an element. For example, the nodes are interconnected in a varying numerical sequence and identified, such as by assigning a number, to indicate which sets of nodes are associated with which element. The methodology advances to diamond 865.

In diamond 865, the user 26 determines whether to represent a contact surface 84 in 2-dimensions. If the user 26 determines to represent a contact surface 84 in 2-dimensions, the methodology advances to block 870 and the user 26 selects areas of the model that are in contact, and the methodology defines the selected contact surfaces 84 in two dimensions. The methodology advances to bubble 890 and returns.

Referring back to diamond 865, if the user 26 determines not to represent a contact surface 84 2-dimensionally, the methodology advances to diamond 875. In diamond 875, the user 26 determines whether to represent a contact surface in 3-dimensions. If the user 26 determines to represent a contact surface 84 in 3-dimensions, the methodology advances to block 880 and the user 26 selects areas of the model that are in contact, and the methodology defines the contact surfaces 84 in three dimensions. The methodology advances to bubble 895 and returns. Returning to diamond 875, if the user 26 determines not to represent the contact surface 84 in three dimensions, the methodology advances to bubble 890 and returns.

Figure 3N:
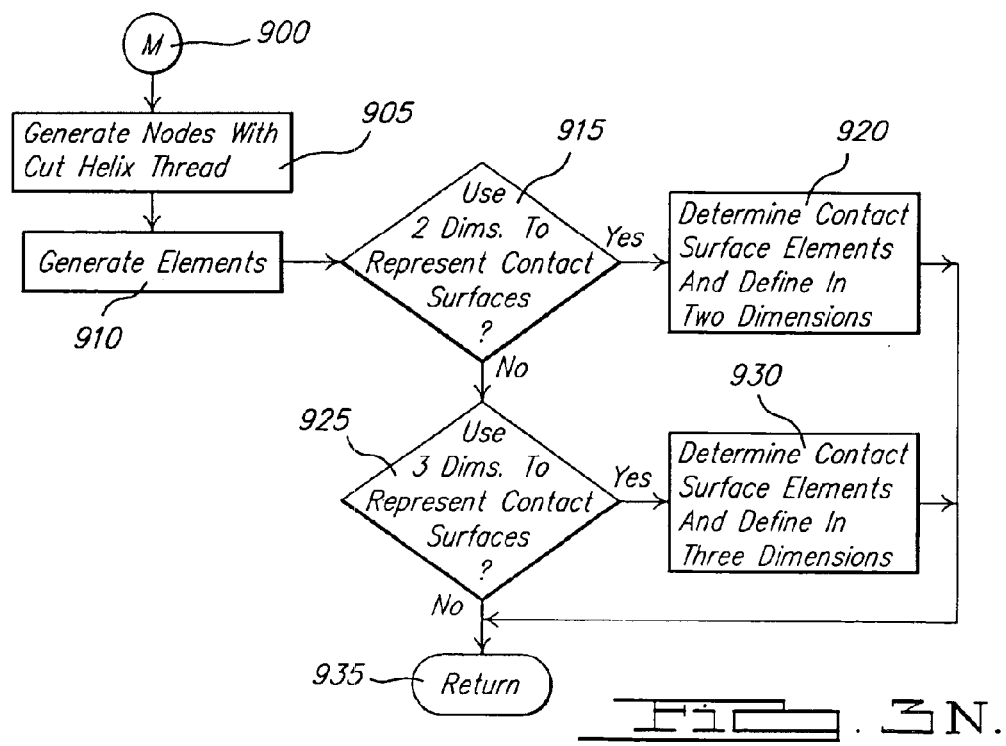

Referring to FIG. 3N, the methodology generates a mesh for the first thread 68a of the threaded portion of the threaded block 58, that can be geometrically represented by a helix. Preferably, a helical meshing technique is used to generate the mesh as described with respect to FIG. 3K. However, for the threaded block the first thread 68a resembles a full helical thread cut with a horizontal plane. The cut is formed by changing the thread profile used, such that a lower portion of the profile is cut away. As the first thread is swept around one revolution, the nodes are laid out beginning with a flat profile and ending with a full profile. Half way through the sweep, the lower half of the profile is cut away. The methodology begins in circle M shown at 900 and continues to block 905. In block 905, the methodology generates nodes for the first thread 68a by cutting the first thread 68a on the helix in the manner described. Preferably, the first thread 68a on the block is cut into on a horizontal plane. The methodology advances to block 910.

In block 910, the methodology generates elements by interconnecting sets of nodes to create an element. For example, the nodes are interconnected in a varying numerical sequence and identified, such as by assigning a number, to indicate which sets of nodes are associated with which element. The methodology advances to diamond 915.

In diamond 915, the user 26 determines whether to represent a contact surface 84 in 2-dimensions. If the user 26 determines to represent a contact surface 84 in 2-dimensions, the methodology advances to block 920 and the user 26 selects areas of the model that are in contact, and the methodology defines the selected contact surfaces 84 in two dimensions. The methodology advances to bubble 935 and returns.

Referring back to diamond 915, if the user 26 determines not to represent a contact surface 84 2-dimensionally, the methodology advances to diamond 925. In diamond 925, the user 26 determines whether to represent a contact surface 84 in 3-dimensions. If the user 26 determines to represent a contact surface 84 in 3-dimensions, the methodology advances to block 930 and the user 26 selects areas of the model that are in contact, and the methodology defines the selected contact surfaces 84 in three dimensions. The methodology advances to bubble 935 and returns. Returning to diamond 925, if the user 26 determines not to represent the contact surface 84 in three dimensions, the methodology advances to bubble 935 and returns.

Figure 3O:
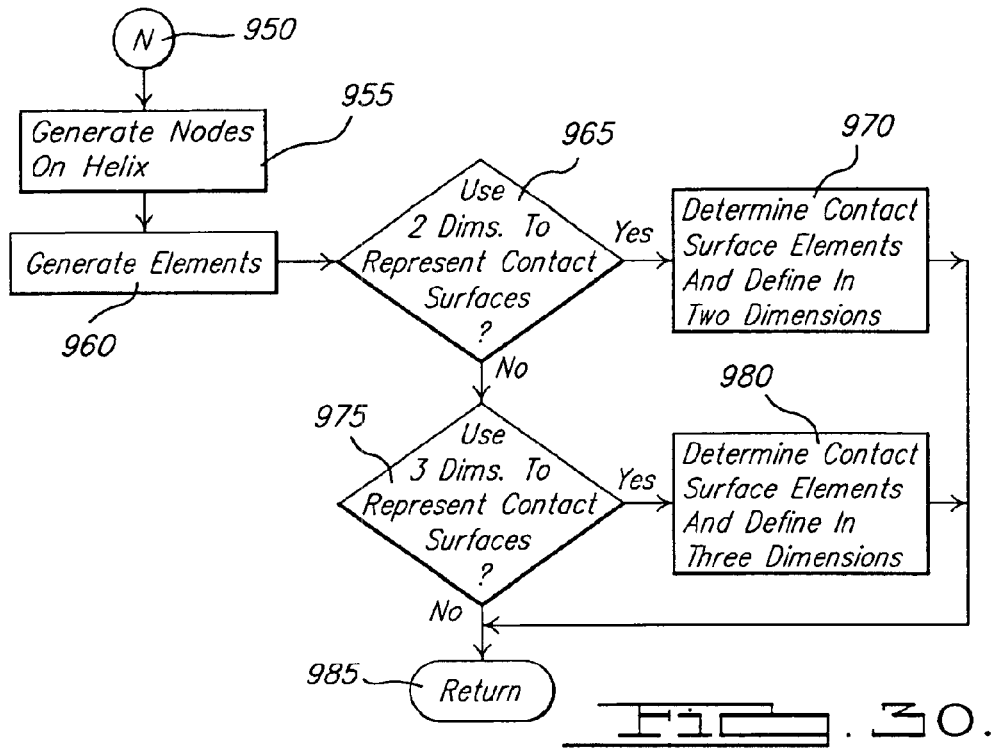

Referring to FIG. 3O, the methodology generates a mesh for the thread body 68b of the threaded block 58, that can be geometrically represented by a helix. Preferably, a helical meshing technique is used to generate the mesh as described with respect to the threaded fastener 32 in FIG. 3L. The methodology begins in circle N shown at 950 and continues to block 955. In block 955, the methodology generates nodes for the thread body 68b by constant progressive growth on the helix. For example, nodes are moved upwards to use the helical coordinate system in a constant progressive manner, as is known in the art. The methodology advances to block 960.

In block 960, the methodology generates elements by interconnecting sets of nodes to create an element. For example, the nodes are interconnected in a varying numerical sequence and identified, such as by assigning a number, to indicate which sets of nodes are associated with which element. The methodology advances to diamond 965.

In diamond 965, the user 26 determines whether to represent a contact surface 84 in 2-dimensions. If the user 26 determines to represent a contact surface 84 in 2-dimension, the methodology advances to block 970. In block 970, the user 26 selects areas of the model that are in contact, and the methodology defines the selected contact surfaces 84 in two dimensions. The methodology advances to bubble 985 and returns.

Referring back to diamond 965, if the user 26 determines not to represent a contact surface 84 2-dimensionally, the methodology advances to diamond 975. In diamond 975, the user 26 determines whether to represent a contact surface 84 in 3-dimensions. If the user 26 determines to represent a contact surface 84 in 3-dimensions, the methodology advances to block 980. In block 980, the user 26 selects areas of the model that are in contact, and the methodology defines the selected contact surfaces 84 in three dimensions. The methodology advances to bubble 985 and returns.

Returning to diamond 975, if the user 26 determines not to represent the contact surface 84 in three dimensions, the methodology advances to bubble 985 and returns.

Figure 3P:
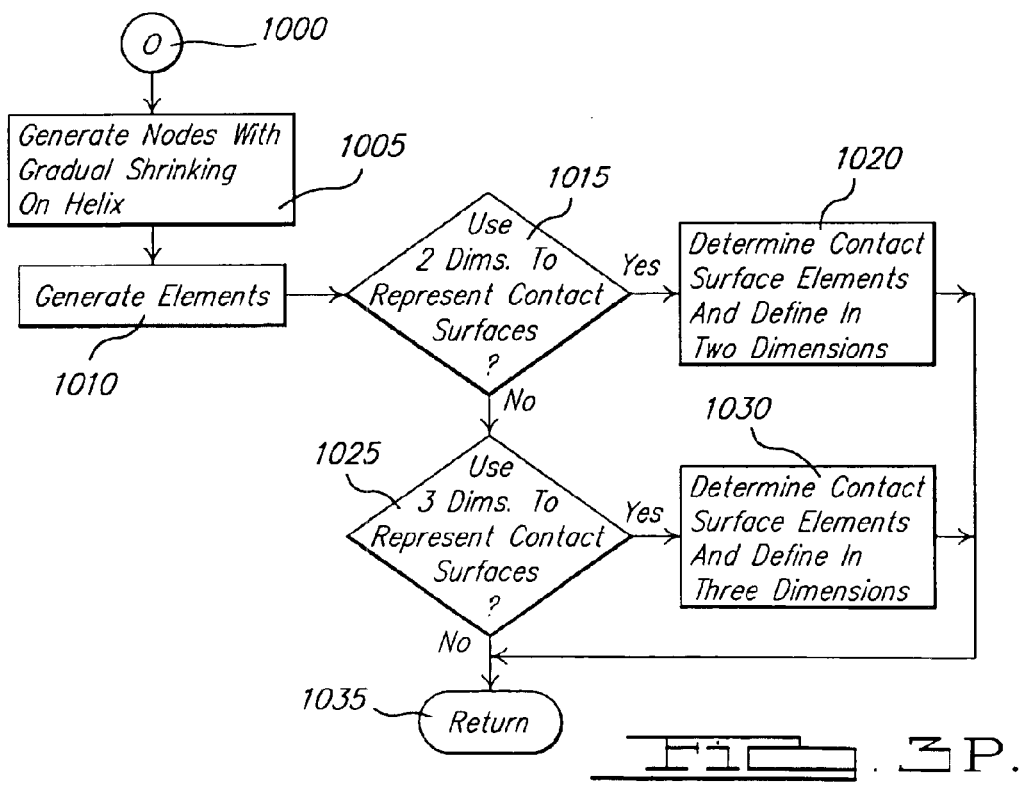

Referring to FIG. 3P, the methodology generates a mesh for the last thread 68c of the threaded block 58, that can be geometrically represented by a helix. Preferably, a helical meshing technique is used to generate the mesh as described with respect to FIG. 3M. The methodology begins in circle O shown at 1000 and continues to block 1005. In block 1005, the methodology generates nodes for the last thread 68c by gradual "shrinking" on the helix. For example, by gradually moving nodes in a radial direction away from the axis of the threaded fastener 22 on the helix to use the coordinate system in a constant manner, as is known in the art. Preferably, the last thread shrinks constantly from a triangular height to a flat surface. The methodology advances to block 1010.

In block 1010, the methodology generates elements by interconnecting sets of nodes to create an element. For example, the nodes are interconnected in a varying numerical sequence and identified, such as by assigning a number, to indicate which sets of nodes are associated with an element. The methodology advances to diamond 1015.

In diamond 1015, the user 26 determines whether to represent a contact surface 84 in 2-dimensions. If the user 26 determines to represent a contact surface 84 in 2-dimensions, the methodology advances to block 1020 and the user 26 selects areas of the model that are in contact, and the methodology defines the selected contact areas in two dimensions. The methodology advances to bubble 1035 and returns.

Referring back to diamond 1015, if the user 26 determines not to represent a contact surface 84 2-dimensionally, the methodology advances to diamond 1025. In diamond 1025, the user 26 determines whether to represent a contact surface in 3-dimensions. If the user 26 determines to represent a contact surface in 3-dimensions, the methodology advances to block 1030 and the user 26 selects areas of the model that are in contact, and the methodology defines the selected contact surfaces 84 in three dimensions. The methodology advances to bubble 1035 and returns. Returning to diamond 1035, if the user 26 determines not to represent the contact surface 84 in three dimensions, the methodology advances to bubble 1035 and returns.

Referring to FIG. 3Q, a growth thread profile is created. A thread profile is a vertical cross section through a thread between columns of hexahedral elements. The methodology begins in circle P shown at 1050 when called for and advances to block 1055. In block 1055, the methodology meshes a starting flat profile. For example, a thread mesh is constructed by creating the nodes on a thread profile and constructing elements between matching nodes of two adjacent profiles. Preferably, the outer two layers of nodes are positioned so that the layers are thin to form boundary layer elements to better represent the high changes in stress near a surface of the threads, and the remaining nodes are smoothed into an optimal position. To connect smoothly to the shaft helix, the first thread profile and the bottom of the thread profiles are hexahedral elements. Advantageously, the smooth connection decreases the opportunity for stress analysis errors between the shaft 38 and threads 48 than would occur if a multi-point constraint is used. The first profile has a flat side which is a continuation of the cylinder. The outer edge of each additional profile bows outward in another percentage step to the size of the full profile. Each growth profile is tilted to create a smooth transition from the shaft diameter to the thread root diameter. The first few profiles are similar to the first one, except that the outer edge is bowed more outward into the shape of the thread.

Figure 7:
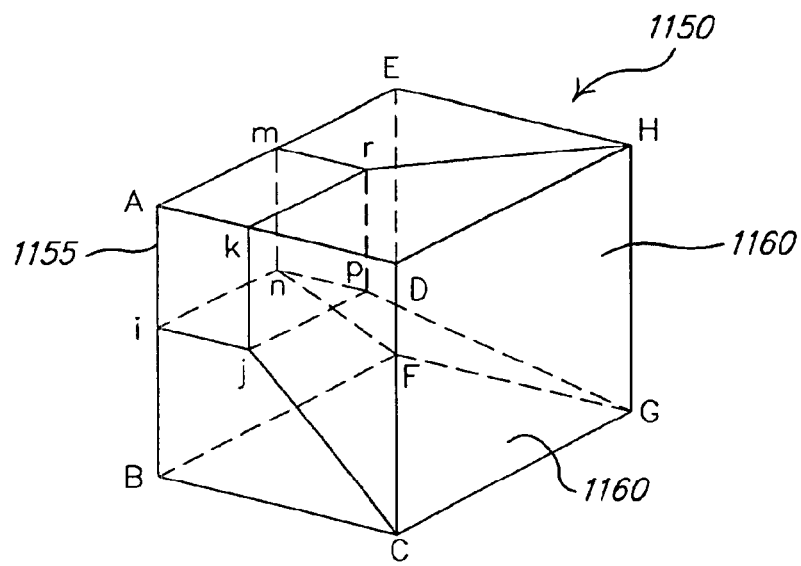
FIG. 7 is an example of a transition profile mesh for a threaded fastener according to the system and method of FIGS. 3A through 3R.

The methodology advances to block 1060 and meshes a transition profile. Preferably, the transition profile allows changing from the flat elements of the shaft to the more dense elements of the full thread. For example, the full hexahedron is shown at 1150 in FIG. 7 and is represented by points ABCDEFGH, which can be divided into smaller hexahedrons Aijkmnpr, iBCjnFGp, kjCDrpGH and mnprEFGH shown at 1155. Faces BCGF, DCGH and EFGH shown at 1160 match with full size hexahedra that are adjacent. The patterns on faces ABCD, ADHE, and ABFE must now propagate through the mesh as smaller elements. Thus, large elements have transitioned to smaller elements in all three directions. The nodes mnpr will be in a position halfway between two profiles that would contain nodes ABCDijk in one profile and EFGH in another. The full transition includes two of these triple transition blocks, the second a mirror image of the first.

The methodology advances to block 1065 and creates a mesh of a wedge profile. It should be appreciated that the wedge elements are used to add additional rows of hexahedron for thread growth. For example, for every few profiles, another pair of nodes is added to the outer shape of the thread. This allows the mesh to maintain a proper density for analytical purposes. Preferably, the number of node pairs is determined from the specifications and the pairs are added at regular intervals through the thread growth process. Two more nodes on the outer shape becomes another row of nodes across the thread. This profile is formed after the first pair of nodes is inserted along the outer shape along with the new row of elements. The quadrilateral faces of these elements form the row just inside the points with five edges. Advantageously, the three edge and five edge points are spread farther apart allowing the thread room to grow in an outward direction. The methodology advances to 1070.

In block 1070, the methodology meshes the hexahedron and pentahedron elements. For example, hexahedral elements are built in locations where two consecutive profiles correspond. This correspondence will cover the whole profile except at transition and wedge profiles. The transition profile requires the creation of the transition hexahedral element. Wedge profiles have one row of pentahedral elements at the new row of nodes across the profile. The methodology advances to block 1075 and returns.

Referring to FIG. 3R a cut thread profile is created for the first thread 68a of the threaded block 58. In this example, the first thread 68a of the threaded block 58 has the appearance of being sheared by the plane that marks the joint with the counter bore 64, and the first thread 68a is built above this plane. Preferably, the first thread 68a is built by constructing the cross-sectional profiles of the mesh. These profiles are the pattern of nodes on a vertical cross-sectional plane through the mesh at regular intervals around the axis of the threaded block 58. Solid elements will be built between these profiles using the nodes in the profiles.

Figure 8A:
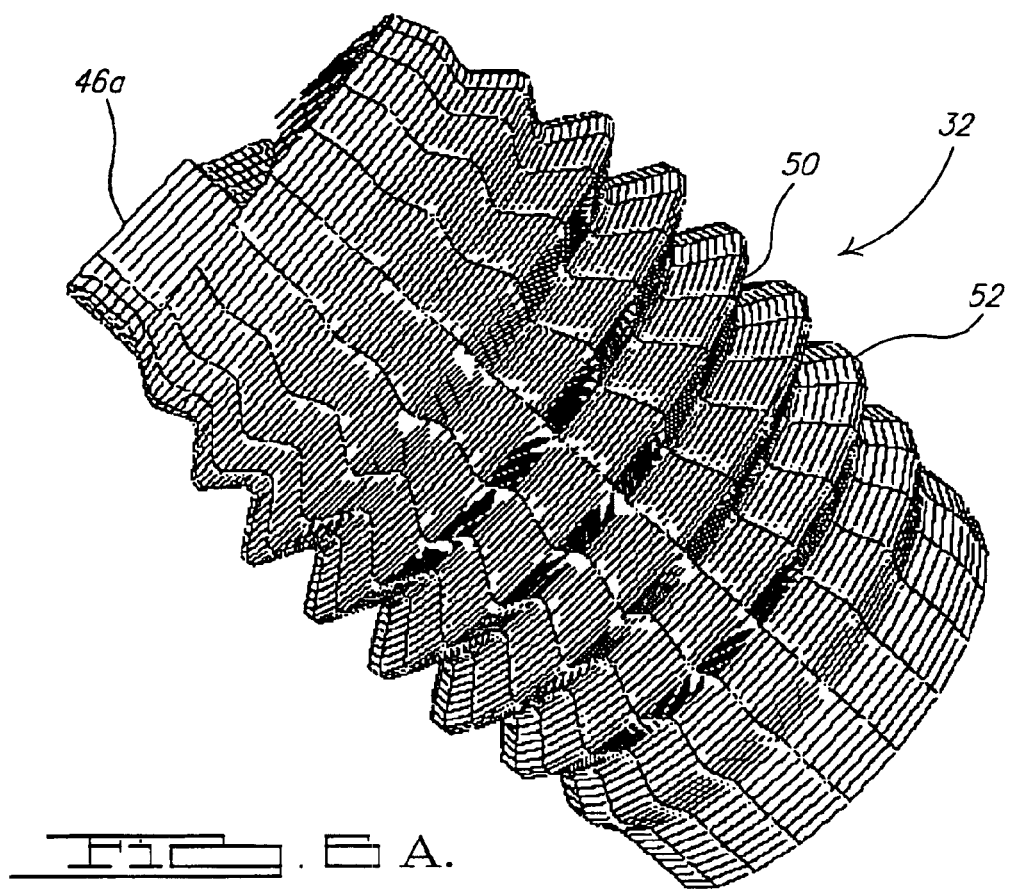
FIGS. 8A through 8C are examples of a transition profile mesh for a threaded block according to the system and method of FIGS. 3A through 3R.

The methodology begins in circle Q shown at 1100 when called for and advances to block 1105. In block 1105, the methodology creates a mesh of a starting threaded block profile consisting of a simple mesh of nodes in regular rows and columns. The first profile consists of one row of nodes and the second profile will have two rows as shown in FIG. 8A at 1180. Additional rows are added in succeeding profiles until the transition profile is needed. The rows of nodes are positioned to fit into the space between the shear plane and the full thread that will be built above it. Though these profiles will be spaced regularly around the block, they are created in the x-z (radial-axial) plane. The methodology advances to block 1110.

In block 1110, the methodology generates a mesh of a transition profile. The transition profile is similar to the transition profile described with respect to the threaded fastener 32, but is made up of only one of the triple transition blocks instead of two. In addition, more rows of nodes are added to the profile to bring the current number of rows to half of the eventual total. The methodology advances to block 1115.

In block 1115, the methodology generates a mesh of the first half of the thread profile to fill in half of the sheared thread. Each succeeding profile extends farther from the thread root as more of the full thread appears above the shear plane. Several of the profiles contain an additional column of nodes as compared to the previous profile, to properly divide the distance between the root and the current extension of the thread. The space between rows of nodes is expanded to fill in the available space between the shear plane and the full thread that will be built above it. The methodology advances to block 1120.

Figure 8B:
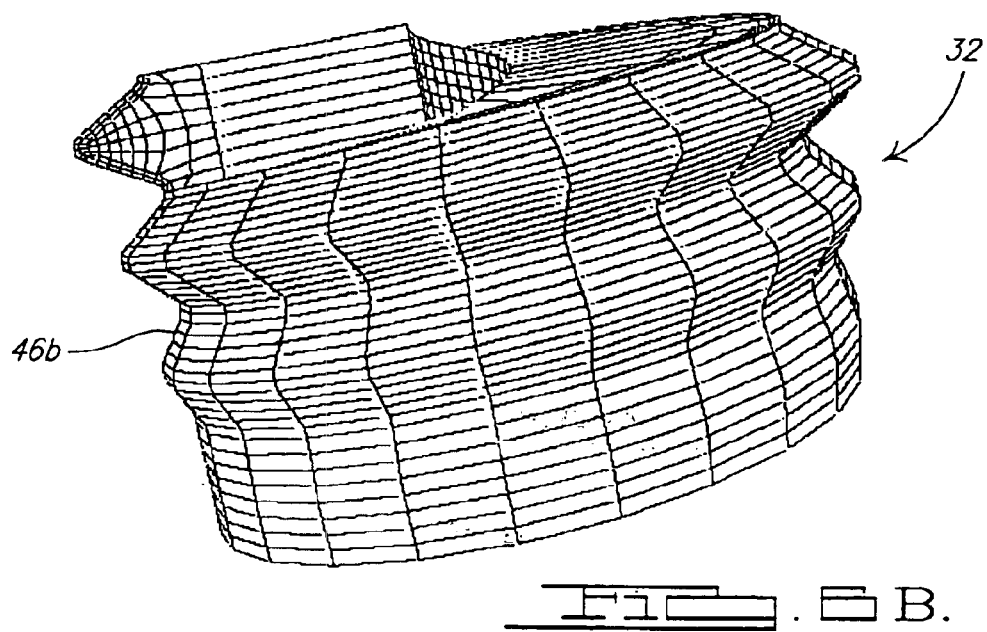
Figure 5C:
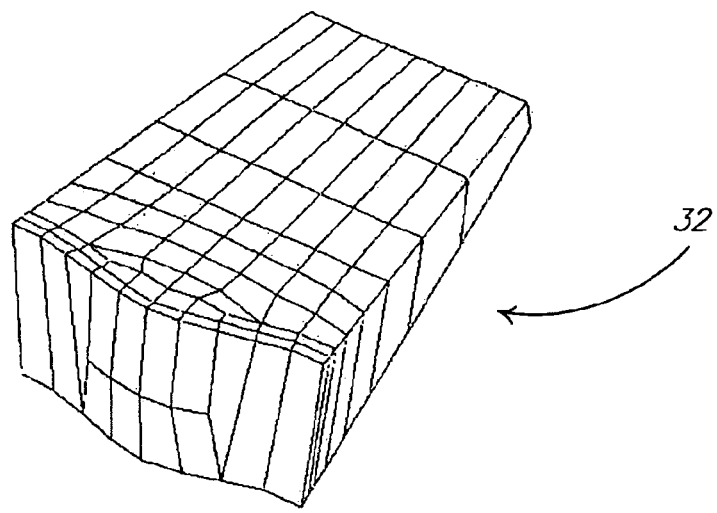
Figure 5D:
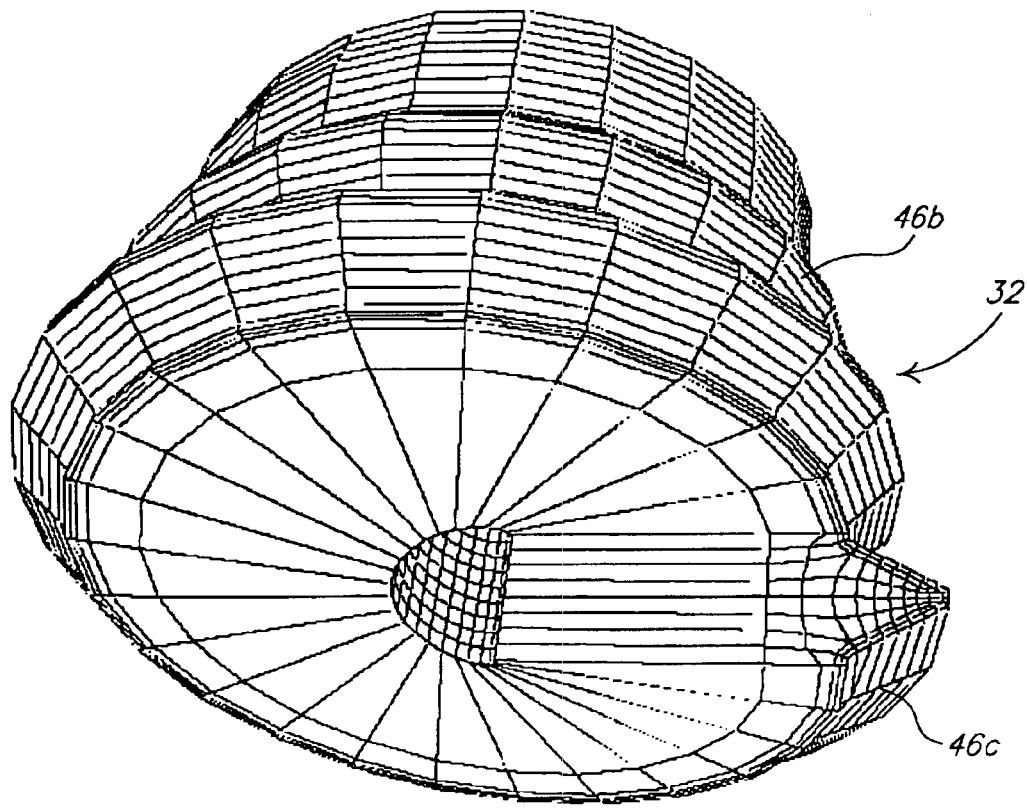

In block 1120, the methodology creates a mesh of a second half of the thread profile affected by the shear plane. Each of these profiles starts with the same pattern of nodes created in the last of the first half profiles. Additional rows of nodes are added to fill out the profile mesh configuration while keeping the mesh confined against the shear plane. As each row is added, the transition pattern of the thread crown and of the lower root is made more complete. Both transition patterns are distorted due to the shear plane compressing the mesh pattern. Referring to FIG. 8B, a full size thread profile is illustrated at 1185. The methodology advances to block 1125.

Figure 8A:
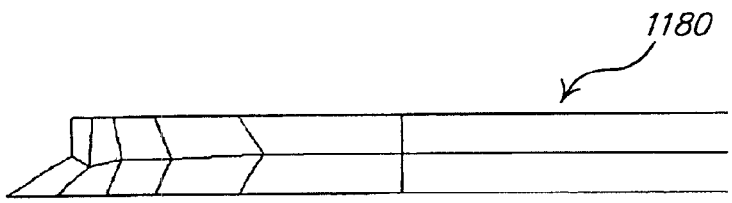
Figure 8B:
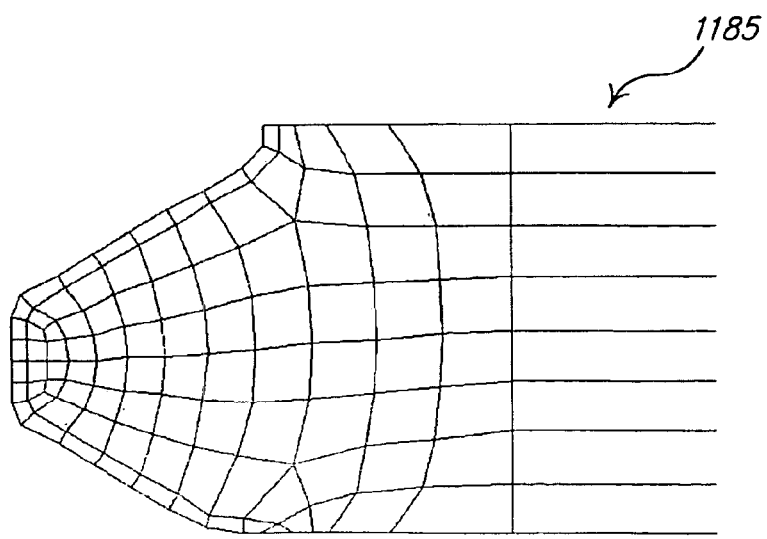
Figure 8C:
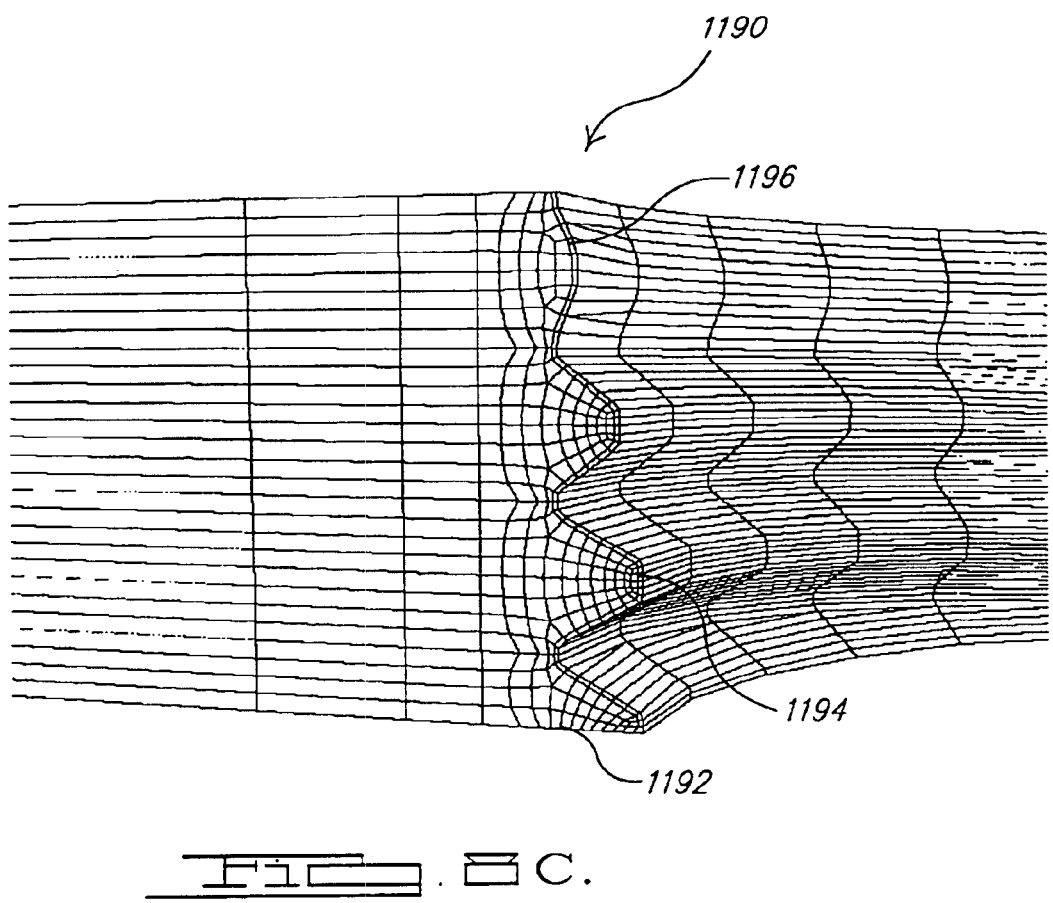

In block 1125, the methodology creates a mesh of solid elements positioned between the profiles. Hexahedral elements are built where two consecutive profiles correspond. Where there are a different number of rows in consecutive profiles, a row of pentahedron elements is created. Where there are a different number of columns in consecutive profiles in the first half of the profiles, a column of pentahedron elements is created. If a row of pentahedron elements intersects a column of pentahedron elements, two tetrahedron elements are created to make the transition. Referring to FIG. 8C, a cross-section of a mesh of the threaded block is illustrated at 1190. A profile constrained against a shear plane is illustrated at 1192, and a full size profile at 1194. A shrink profile is illustrated at 1196. The methodology advances to bubble 1130 and returns.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A system of generating a finite element mesh for a threaded fastener and joining structure assembly comprising:
   a computer system, wherein said computer system includes a memory, a processor, an input device and a display device;
   a mesh model of the threaded fastener and joining structure assembly generated on the computer system wherein nodes and elements for each non-threaded portion of the threaded fastener and joining structure assembly are created using cylindrical coordinates and nodes and elements for each threaded portion of the threaded fastener and joining structure assembly are created using helical coordinates;
   a mesh generated for a fastener joining together a clearance hole block and a threaded block, wherein said mesh of the fastener includes nodes created in radial, tangential and vertical directions for each non-threaded portion of the fastener using cylindrical coordinates and elements defined by interconnecting the nodes, nodes created for each transition portion of the fastener transitioning between the non-threaded portion of the fastener and a threaded portion of the fastener by stretching a hexahedral element in a vertical direction while sweeping about a vertical axis, and elements defined by interconnecting the nodes and interleaving wedge elements at the end of a revolution, a mesh of the fastener thread generated using helical coordinates, and nodes for each transition portion of the fastener transitioning between the fastener threads and a non-threaded portion of the fastener created by shrinking a hexahedral element in a vertical direction while sweeping about a vertical axis, and elements defined by interconnecting the nodes and interleaving wedge elements at the end of a revolution; and
   wherein a mesh of the fastener threads includes:
   a mesh of a first thread of the fastener threads, wherein nodes are created using gradual stretching on a helix by moving nodes upwards to helical coordinates while sweeping about a vertical axis, and elements defined by interconnecting the nodes;
   a mesh of a thread body of the fastener threads, wherein nodes are created using constant stretching on a helix by moving nodes upwards to helical coordinates while sweeping about a vertical axis, and elements defined by interconnecting the nodes; and
   a mesh of a last thread of the fastener threads, wherein nodes are created using gradual shrinking on a helix by moving nodes downward to cylindrical coordinates while sweeping about a vertical axis, and elements are defined by interconnecting the nodes.

2. A system of generating a finite element mesh for a threaded fastener and joining structure assembly comprising:
   a computer system, wherein said computer system includes a memory, a processor, an input device and a display device; and
   a mesh model of the threaded fastener and joining structure assembly generated on the computer system wherein nodes and elements for each non-threaded portion of the threaded fastener and joining structure assembly are created using cylindrical coordinates and nodes and elements for each threaded portion of the threaded fastener and joining structure assembly are created using helical coordinates;
   a mesh generated for a fastener joining together a clearance hole block and a threaded block, wherein said mesh of the fastener includes nodes created in radial, tangential and vertical directions for each non-threaded portion of the fastener using cylindrical coordinates and elements defined by interconnecting the nodes, nodes created for each transition portion of the fastener transitioning between the non-threaded portion of the fastener and a threaded portion of the fastener by stretching a hexahedral element in a vertical direction while sweeping about a vertical axis, and elements defined by interconnecting the nodes and interleaving wedge elements at the end of a revolution, a mesh of the fastener thread generated using helical coordinates, and nodes for each transition portion of the fastener transitioning between the fastener threads and a non-threaded portion of the fastener created by shrinking a hexahedral element in a vertical direction while sweeping about a vertical axis, and elements defined by interconnecting the nodes and interleaving wedge elements at the end of a revolution; and wherein said mesh of the fastener threads includes:

a growth thread profile for the first thread of the fastener threads created by taking a vertical cross-section through a thread between columns of hexahedral elements;

a constant thread profile created using hexahedral elements for the thread body of the fastener threads;

a shrink thread profile created for the last thread of the fastener threads; and a helical mesh of the fastener threads created by spinning the growth thread profile, constant thread profile and shrink thread profile.

3. A system of generating a finite element mesh for a threaded fastener and joining structure assembly comprising:

a computer system, wherein said computer system includes a memory, a processor, an input device and a display device; and a mesh model of the threaded fastener and joining structure assembly generated on the computer system wherein nodes and elements for each non-threaded portion of the threaded fastener and joining structure assembly are created using cylindrical coordinates and nodes and elements for each threaded portion of the threaded fastener and joining structure assembly are created using helical coordinates;

a mesh generated for a fastener joining together a clearance hole block and a threaded block, wherein said mesh of the threaded block includes nodes created in radial, tangential and vertical directions for each non-threaded portion of the threaded block using cylindrical coordinates and elements defined by interconnecting the nodes, nodes created for each transition portion of the threaded block transitioning between the non-threaded portion of the threaded block and a threaded portion of the block by stretching a hexahedral element in a vertical direction while sweeping about a vertical axis, and elements defined by interconnecting the nodes and interleaving wedge elements at the end of a revolution, a mesh of the threaded block threads generated using helical coordinates, and nodes for each transition portion of the threaded block transitioning between the threaded block threads and a non-threaded portion of the threaded block created by shrinking a hexahedral element in a vertical direction while sweeping about a vertical axis, and elements defined by interconnecting the nodes and interleaving wedge elements at the end of a revolution; and wherein said mesh of the threaded block threads includes:

a mesh of a first thread of the threaded block threads, wherein nodes are created using gradual stretching on a helix by moving nodes upwards to helical coordinates while sweeping about a vertical axis, and elements are defined by interconnecting the nodes;

a mesh of a thread body of the threaded block threads, wherein nodes are created using constant stretching on a helix by moving nodes upwards to helical coordinates while sweeping about a vertical axis, and elements defined by interconnecting the nodes; and a mesh of a last thread of the threaded block threads, wherein nodes are created using gradual shrinking on a helix by moving nodes downward to cylindrical coordinates while sweeping about a vertical axis, and elements defined by interconnecting the nodes.

4. A system of generating a finite element mesh for a threaded fastener and joining structure assembly comprising:

a computer system, wherein said computer system includes a memory, a processor, an input device and a display device; and a mesh model of the threaded fastener and joining structure assembly generated on the computer system wherein nodes and elements for each non-threaded portion of the threaded fastener and joining structure assembly are created using cylindrical coordinates and nodes and elements for each threaded portion of the threaded fastener and joining structure assembly are created using helical coordinates;

a mesh generated for a fastener joining together a clearance hole block and a threaded block, wherein said mesh of the threaded block includes nodes created in radial, tangential and vertical directions for each non-threaded portion of the threaded block using cylindrical coordinates and elements defined by interconnecting the nodes, nodes created for each transition portion of the threaded block transitioning between the non-threaded portion of the threaded block and a threaded portion of the block by stretching a hexahedral element in a vertical direction while sweeping about a vertical axis, and elements defined by interconnecting the nodes and interleaving wedge elements at the end of a revolution, a mesh of the threaded block threads generated using helical coordinates, and nodes for each transition portion of the threaded block transitioning between the threaded block threads and a non-threaded portion of the threaded block created by shrinking a hexahedral element in a vertical direction while sweeping about a vertical axis, and elements defined by interconnecting the nodes and interleaving wedge elements at the end of a revolution; and wherein said mesh of the threaded block threads includes:

a growth thread profile for the first thread of the threaded block threads created by taking a vertical cross-section through a thread between columns of hexahedral elements;

a constant thread profile created using hexahedral elements for thread body of the threaded block threads;

a shrink thread profile created for the last thread of the threaded block threads; and a helical mesh of the threaded block threads created by spinning the growth thread profile, constant thread profile and shrink thread profile.

5. A system as set forth in claim 2 or claim 4 wherein said constant thread profile includes:

a mesh of a starting flat profile of a hexahedral element;

a mesh of a transition profile from the flat element to a helical element of the thread created by transitioning between a larger element to smaller elements;

a mesh of a wedge profile wherein additional rows of a hexahedron elements are added for thread growth; and a mesh of a hexahedron and pentahedron elements created where two consecutive profiles correspond.

6. A method of generating a finite element mesh for a threaded fastener and joining structure assembly, said method comprising the steps of:

determining a type of model for a threaded fastener and joining structure assembly;

generating a mesh of the model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates;

generating a mesh for a fastener joining together a clearance hole block and a threaded block;

meshing the fastener, wherein said step of meshing the fastener includes creating nodes in radial, tangential and vertical directions for each non-threaded portion of the fastener using cylindrical coordinates and defining elements by interconnecting the nodes, creating nodes for each transition portion of the fastener transitioning between the non-threaded portion of the fastener and a threaded portion of the fastener by stretching a hexahedral element in a vertical direction while sweeping about a vertical axis, and defining elements by interconnecting the nodes and interleaving wedge elements at the end of a revolution, generating a mesh of the fastener threads using helical coordinates, and creating nodes for each transition portion of the fastener transitioning between the fastener threads and a non-threaded portion of the fastener by shrinking a hexahedral element in a vertical direction while sweeping about a vertical axis, and defining elements by interconnecting the nodes and interleaving wedge elements at the end of a revolution; and wherein said step of generating a mesh of the fastener threads includes the steps of:

meshing a first thread of the fastener threads by creating nodes using gradual stretching on a helix by moving nodes upwards to helical coordinates while sweeping about a vertical axis, and defining elements by interconnecting the nodes;

meshing a thread body of the fastener threads by creating nodes using constant stretching on a helix by moving nodes upwards to helical coordinates while sweeping about a vertical axis, and defining elements by interconnecting the nodes; and meshing a last thread of the fastener threads by creating nodes using gradual shrinking on a helix by moving nodes downward to cylindrical coordinates while sweeping about a vertical axis, and defining elements by interconnecting the nodes.

7. A method of generating a finite element mesh for a threaded fastener and joining structure assembly, said method comprising the steps of:

determining a type of model for a threaded fastener and joining structure assembly;

generating a mesh of the model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates;

generating a mesh for a fastener joining together a clearance hole block and a threaded block;

meshing the fastener, wherein said step of meshing the fastener includes creating nodes in radial, tangential and vertical directions for each non-threaded portion of the fastener using cylindrical coordinates and defining elements by interconnecting the nodes, creating nodes for each transition portion of the fastener transitioning between the non-threaded portion of the fastener and a threaded portion of the fastener by stretching a hexahedral element in a vertical direction while sweeping about a vertical axis, and defining elements by interconnecting the nodes and interleaving wedge elements at the end of a revolution, generating a mesh of the fastener threads using helical coordinates, and creating nodes for each transition portion of the fastener transitioning between the fastener threads and a non-threaded portion of the fastener by shrinking a hexahedral element in a vertical direction while sweeping about a vertical axis, and defining elements by interconnecting the nodes and interleaving wedge elements at the end of a revolution; and wherein said step of generating a mesh of the fastener threads includes the steps of:

creating a growth thread profile for the first thread of the fastener threads by taking a vertical cross-section through a thread between columns of hexahedral elements;

creating a constant thread profile using hexahedral elements for the thread body of the fastener threads;

creating a shrink thread profile for the last thread of the fastener threads; and spinning the growth thread profile, constant thread profile and shrink thread profile into a helical mesh of the fastener threads.

8. A method of generating a finite element mesh for a threaded fastener and joining structure assembly, said method comprising the steps of:

determining a type of model for a threaded fastener and joining structure assembly;

generating a mesh of the model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates;

generating a mesh for a fastener joining together a clearance hole block and a threaded block;

meshing the threaded block, wherein said step of meshing the threaded block includes creating nodes in radial, tangential and vertical directions for each non-threaded portion of the threaded block using cylindrical coordinates and defining elements by interconnecting the nodes, creating nodes for each transition portion of the threaded block transitioning between the non-threaded portion of the threaded block and a threaded portion of the block by stretching a hexahedral element in a vertical direction while sweeping about a vertical axis, and defining elements by interconnecting the nodes and interleaving wedge elements at the end of a revolution, generating a mesh of the threaded block threads using helical coordinates, and creating nodes for each transition portion of the threaded block transitioning between the threaded block threads and a non-threaded portion of the threaded block by shrinking a hexahedral element in a vertical direction while sweeping about a vertical axis, and defining elements by interconnecting the nodes and interleaving wedge elements at the end of a revolution; and wherein said step of generating a mesh of the threaded block threads includes the steps of:

meshing a first thread of the threaded block threads by creating nodes using gradual stretching on a helix by moving nodes upwards to helical coordinates while sweeping about a vertical axis, and defining elements by interconnecting the nodes;

meshing a thread body of the threaded block threads by creating nodes using constant stretching on a helix by moving nodes upwards to helical coordinates while sweeping about a vertical axis, and defining elements by interconnecting the nodes; and meshing a last thread of the threaded block threads by creating nodes using gradual shrinking on a helix by moving nodes downward to cylindrical coordinates while sweeping about a vertical axis, and defining elements by interconnecting the nodes.

9. A method of generating a finite element mesh for a threaded fastener and joining structure assembly, said method comprising the steps of:

determining a type of model for a threaded fastener and joining structure assembly;

generating a mesh of the model of the threaded fastener and joining structure assembly by creating nodes and elements for each non-threaded portion of the threaded fastener and joining structure assembly using cylindrical coordinates and creating nodes and elements for each threaded portion of the threaded fastener and joining structure assembly using helical coordinates;

generating a mesh for a fastener joining together a clearance hole block and a threaded block;

meshing the threaded block, wherein said step of meshing the threaded block includes creating nodes in radial, tangential and vertical directions for each non-threaded portion of the threaded block using cylindrical coordinates and defining elements by interconnecting the nodes, creating nodes for each transition portion of the threaded block transitioning between the non-threaded portion of the threaded block and a threaded portion of the block by stretching a hexahedral element in a vertical direction while sweeping about a vertical axis, and defining elements by interconnecting the nodes and interleaving wedge elements at the end of a revolution, generating a mesh of the threaded block threads using helical coordinates, and creating nodes for each transition portion of the threaded block transitioning between the threaded block threads and a non-threaded portion of the threaded block by shrinking a hexahedral element in a vertical direction while sweeping about a vertical axis, and defining elements by interconnecting the nodes and interleaving wedge elements at the end of a revolution; and wherein said step of generating a mesh of the threaded block threads includes the steps of:

creating a growth thread profile for the first thread of the threaded block threads by taking a vertical cross-section through a thread between columns of hexahedral elements;

creating a constant thread profile using hexahedral elements for thread body of the threaded block threads;

creating a shrink thread profile for the last thread of the threaded block threads; and spinning the growth thread profile, constant thread profile and shrink thread profile into a helical mesh of the threaded block threads.

10. A method as set forth in claim 7 or claim 9 wherein said step of creating a constant thread profile includes the steps of:

meshing a starting flat profile of a hexahedral element;

meshing a transition profile from the flat element to a helical element of the thread by transitioning between a larger element to smaller elements;

meshing a wedge profile to add additional rows of hexahedron elements for thread growth; and meshing hexahedron and pentahedron elements where two consecutive profiles correspond.

11. A method of generating a finite element mesh for a threaded fastener and joining structure assembly, said method comprising the steps of:

specifying a parameter describing the threaded fastener and joining structure assembly, wherein the threaded fastener and joining structure assembly includes a bolt, clearance hole block and threaded block;

generating a mesh model of each non-threaded portion of the bolt by generating nodes and elements for each non-threaded portion of the bolt as a cylinder using cylindrical coordinates;

meshing a first thread of a bolt thread by creating nodes using gradual stretching on a helix by moving nodes upwards to helical coordinates while sweeping about a vertical axis, and defining elements by interconnecting the nodes in a varying numerical sequence;

meshing a thread body of the bolt threads by creating nodes using constant stretching on a helix by moving nodes upwards to helical coordinates while sweeping about a vertical axis, and defining elements by interconnecting the nodes in a varying numerical sequence;

meshing a last thread of the bolt thread by creating nodes using gradual shrinking on a helix by moving nodes downward to cylindrical coordinates while sweeping about a vertical axis, and defining elements by interconnecting the nodes in a varying numerical sequence;

creating a mesh model of the clearance hole block by generating nodes and elements as a cylinder using cylindrical coordinates;

creating a mesh model of each non-threaded portion of the threaded block by generating nodes and elements for each non-threaded portion of the bolt as a cylinder using cylindrical coordinates;

meshing a first thread of the threaded block threads by creating nodes using gradual stretching on a helix by moving nodes upwards to helical coordinates while sweeping about a vertical axis, and defining elements by interconnecting the nodes in a varying numerical sequence;

meshing a thread body of the threaded block threads by creating nodes using constant stretching on a helix by moving nodes upwards to helical coordinates while sweeping about a vertical axis, and defining elements by interconnecting the nodes in a varying numerical sequence; and meshing a last thread of the threaded block threads by creating nodes using gradual shrinking on a helix by moving nodes downward to cylindrical coordinates while sweeping about a vertical axis, and defining elements by interconnecting the nodes in a varying numerical sequence.

12. A method as set forth in claim 11 wherein said step of meshing the non-threaded portions of the bolt includes the steps of:

creating nodes in radial, tangential and vertical directions for each non-threaded portion of the bolt using cylindrical coordinates and defining elements by interconnecting the nodes in a varying numerical sequence;

creating nodes for each transition portion of the bolt transitioning between the non-threaded portion of the bolt and a bolt thread by stretching a hexahedral element in a vertical direction while sweeping about a vertical axis, and defining elements by interconnecting the nodes in a varying numerical sequence and interleaving wedge elements at the end of a revolution; and creating nodes for each transition portion of the bolt transitioning between the bolt threads and a non-threaded portion of the bolt by shrinking a hexahedral element in a vertical direction while sweeping about a vertical axis, and defining elements by interconnecting the nodes in a varying numerical sequence and interleaving wedge elements at the end of a revolution.

13. A method as set forth in claim 11 wherein said step of meshing the non-threaded portions of the threaded block includes the steps of:

creating nodes in radial, tangential and vertical directions for each non-threaded portion of the threaded block using cylindrical coordinates and defining elements by interconnecting the nodes in a varying numerical sequence;

creating nodes for each transition portion of the threaded block transitioning between the non-threaded portion of the threaded block and a threaded block thread by stretching a hexahedral element in a vertical direction while sweeping about a vertical axis, and defining elements by interconnecting the nodes in a varying numerical sequence and interleaving wedge elements at the end of a revolution; and creating nodes for each transition portion of the threaded block transitioning between the threaded block threads and a non-threaded portion of the threaded block by shrinking a hexahedral element in a vertical direction while sweeping about a vertical axis, and defining elements by interconnecting the nodes in a varying numerical sequence and interleaving wedge elements at the end of a revolution.

14. A method as set forth in claim 11 wherein said step of meshing the clearance hole block includes positioning nodes in radial, tangential and vertical directions for each portion of the clearance hole block using cylindrical coordinates and defining elements by interconnecting the nodes in a varying numerical sequence.

15. A method of generating a finite element mesh for a threaded fastener and joining structure assembly, said method comprising the steps of:

specifying a parameter describing the threaded fastener and joining structure assembly, wherein the threaded fastener and joining structure assembly includes a bolt, clearance hole block and threaded block;

generating a mesh model of each non-threaded portion of the bolt by generating nodes and elements for each non-threaded portion of the bolt as a cylinder using cylindrical coordinates;

creating a growth thread profile for a first thread of the bolt threads by taking a vertical cross-section through a thread between columns of hexahedral elements;

creating a constant thread profile using hexahedral elements for a thread body of the bolt threads;

creating a shrink thread profile for the last thread of the bolt threads;

spinning the growth thread profile, constant thread profile and shrink thread profile into a helical mesh of the bolt threads;

generating a mesh model of the clearance hole block by generating nodes and elements as a cylinder using cylindrical coordinates;

generating a mesh model of each non-threaded portion of the threaded block by generating nodes and elements for each non-threaded portion of the bolt as a cylinder using cylindrical coordinates;

creating a growth thread profile for the first thread of the threaded block threads by taking a vertical cross-section through a thread between columns of hexahedral elements;

creating a constant thread profile using hexahedral elements for a thread body of the threaded block threads;

creating a shrink thread profile for the last thread of the threaded block threads; and spinning the growth thread profile, constant thread profile, and shrink thread profile into a helical mesh of the threaded block threads.

16. A method as set forth in claim 15 wherein said step of meshing the non-threaded portions of the bolt includes the steps of:

creating nodes in radial, tangential and vertical directions for each non-threaded portion of the bolt using cylindrical coordinates and defining elements by interconnecting the nodes in a varying numerical sequence;

creating nodes for each transition portion of the bolt transitioning between the non-threaded portion of the bolt and a bolt thread by stretching a hexahedral element in a vertical direction while sweeping about a vertical axis, and defining elements by interconnecting the nodes in a varying numerical sequence and interleaving wedge elements at the end of a revolution; and creating nodes for each transition portion of the bolt transitioning between the bolt thread and a non-threaded portion of the bolt by shrinking a hexahedral element in a vertical direction while sweeping about a vertical axis, and defining elements by interconnecting the nodes in a varying numerical sequence and interleaving wedge elements at the end of a revolution.

17. A method as set forth in claim 15 wherein said step of meshing the non-threaded portions of the threaded block includes the steps of:

creating nodes in radial, tangential and vertical directions for each non-threaded portion of the threaded block using cylindrical coordinates and defining elements by interconnecting the nodes in a varying numerical sequence;

creating nodes for each transition portion of the threaded block transitioning between the non-threaded portion of the threaded block and a threaded block thread by stretching a hexahedral element in a vertical direction while sweeping about a vertical axis, and defining elements by interconnecting the nodes in a varying numerical sequence and interleaving wedge elements at the end of a revolution; and creating nodes for each transition portion of the threaded block transitioning between the threaded block threads and a non-threaded portion of the threaded block by shrinking a hexahedral element in a vertical direction while sweeping about a vertical axis, and generating elements by sequentially interconnecting the nodes and interleaving wedge elements at the end of a revolution.

18. A method as set forth in claim 15 wherein said step of meshing the clearance hole block includes creating nodes in radial, tangential and vertical directions for each portion of the clearance hole block using cylindrical coordinates and defining elements by interconnecting the nodes in a varying numerical sequence.

* * * * *